(12) United States Patent
Milanovic

(10) Patent No.: US 8,729,770 B1
(45) Date of Patent: *May 20, 2014

(54) MEMS ACTUATORS WITH COMBINED FORCE AND BI-DIRECTIONAL ROTATION

(75) Inventor: Veljko Milanovic, El Cerrito, CA (US)

(73) Assignee: Adriatic Research Institute, Richmond, CA (US)

( * ) Notice: Subject to any disclaimer, the term of this patent is extended or adjusted under 35 U.S.C. 154(b) by 401 days.

This patent is subject to a terminal disclaimer.

(21) Appl. No.: 12/781,766

(22) Filed: May 17, 2010

Related U.S. Application Data

(60) Continuation-in-part of application No. 11/938,197, filed on Nov. 9, 2007, now Pat. No. 8,043,513, which is a division of application No. 11/003,271, filed on Dec. 2, 2004, now Pat. No. 7,295,726.

(60) Provisional application No. 61/179,334, filed on May 18, 2009, provisional application No. 60/526,510, filed on Dec. 2, 2003.

(51) Int. Cl.
*H02N 1/00* (2006.01)
*H02N 1/04* (2006.01)

(52) U.S. Cl.
USPC ...... 310/309; 310/308; 310/310; 310/40 MM

(58) Field of Classification Search
CPC ........ H02N 1/008; H02N 1/004; H02N 1/006
USPC ............................ 310/309, 40 MM, 310, 308
See application file for complete search history.

(56) References Cited

U.S. PATENT DOCUMENTS

| | | | |
|---|---|---|---|
| 4,492,465 A | 1/1985 | Erdmann et al. | |
| 4,838,696 A | 6/1989 | Pryor | |
| 5,305,091 A | 4/1994 | Gelbart et al. | |
| 6,133,670 A * | 10/2000 | Rodgers et al. | 310/309 |
| 6,509,670 B2 * | 1/2003 | Jeong et al. | 310/309 |
| 6,593,677 B2 * | 7/2003 | Behin et al. | 310/309 |
| 6,760,144 B2 * | 7/2004 | Hill et al. | 359/290 |
| 7,078,672 B2 | 7/2006 | Xie et al. | |
| 7,129,617 B2 * | 10/2006 | Hong | 310/309 |
| 7,184,022 B2 | 2/2007 | Xie et al. | |

(Continued)

OTHER PUBLICATIONS

Huikai Xie et al., A CMOS-MEMS Mirror with Curled-Hinge Comb Drives, Aug. 2003, Journal of Microelectromechanical Systems, vol. 12, pp. 450-457.*

(Continued)

*Primary Examiner* — Terrance Kenerly
(74) *Attorney, Agent, or Firm* — Joshua D. Isenberg; JDI Patent

(57) ABSTRACT

A MEMS system comprises a first rotational actuator having a first drive mechanism configured to drive rotation of a first rotator about a first axis, a second rotational actuator having a second drive mechanism configured to drive rotation of a second rotator about a second axis, first and second flexible linkages, a first drive beam coupled to the first rotator and to the first flexible linkage, a second drive beam coupled to the second rotator and to the second flexible linkage, and one or more device mounts coupled to the first and second flexible linkages. The one or more device mounts are configured to provide distributed points of attachment of a device. The rotation of the first and second rotators causes the device mount to rotate or piston.

30 Claims, 24 Drawing Sheets

(56) References Cited

U.S. PATENT DOCUMENTS

| | | | |
|---|---|---|---|
| 7,247,968 B2 * | 7/2007 | Baeck et al. | 310/309 |
| 7,295,726 B1 | 11/2007 | Milanovic et al. | |
| 7,359,041 B2 | 4/2008 | Xie et al. | |
| 7,428,353 B1 | 9/2008 | Milanovic et al. | |
| 2005/0052723 A1 * | 3/2005 | Watanabe et al. | 359/290 |
| 2006/0082250 A1 * | 4/2006 | Ko et al. | 310/309 |
| 2008/0054757 A1 * | 3/2008 | Aksyuk et al. | 310/309 |
| 2008/0061026 A1 | 3/2008 | Milanovic et al. | |
| 2010/0008588 A1 | 1/2010 | Feldkhun et al. | |

OTHER PUBLICATIONS

V. Milanovic, D.T. McCormick, G. Matus, "Gimbal-less Monolithic Silicon Actuators for Tip-Tilt-Piston Micromiror Applications", IEEE J. of Select Topics in Quantum Electronics, vol. 10, Issue: 3, May-Jun. 2004, pp. 462-471.

J. Brophy-Warren, "Magic Wand: How Hackers Make Use of Their Wii-motes," The Wall Street Journal, Apr. 28, 2007 download from http://www.discussanything.com/forums/showthread.php?t=103730 on Sep. 14, 2010.

P. Arcara, et al, "Perception of Depth Informatiuon by Means of a Wire-Actuated Haptic Interface," Proc. of 2000 IEEE Int. Conf. on Robotics and Automation, Apr. 2000.

A. Cassinelli, et al., "Smart Laser-Scanner for 3D Huamn-Machine Interface," Int. Conf. on Human Factors in Computing Systems, Portland, OR, Apr. 2-7, 2005, pp. 1138-1139.

S. Perrin, et al, "Laser-Based Finger Tracking System Suitable for MOEMS Integration," Image and Vision Computing, New Zealand, Nov. 26-28, 2003, pp. 131-136.

F. Blais, J.-A. Beraldin, S. El-Hakim, and L. Cournoyer, "Comparison of Pose Estimation Methods for a 3D Laser Tracking System using Triangulation and Programmetry Techniques," SPIE Proceedings, Electronic Imagine 2001, Videometrics and Optical Methods for 3D Shape Measurement VII, San Jose, CA. Jan. 21-26, 2001.

V. Millanović, W. K. Lo, "Fast and high-Precision 3D Tracking and Position Measurement with MEMS Micromirros", 2008 IEEE/LEOS International Conference on Optical MEMs and Nanophotonics, ISBN: 978-1-4244-1917-3, pp. 72-73, Freiburg, Germany, Aug. 11-14, 2008.

Office Action dated May 14, 2010 issued for U.S. Appl. No. 12/533,093.

U.S. Appl. No. 60/526,510, filed Dec. 2, 2003.
U.S. Appl. No. 61/179,334, filed May 18, 2009.
U.S. Appl. No. 12/538,093, filed Aug. 7, 2009.
U.S. Appl. No. 61/087,604, filed Aug. 8, 2008.

\* cited by examiner

Fig. 3A
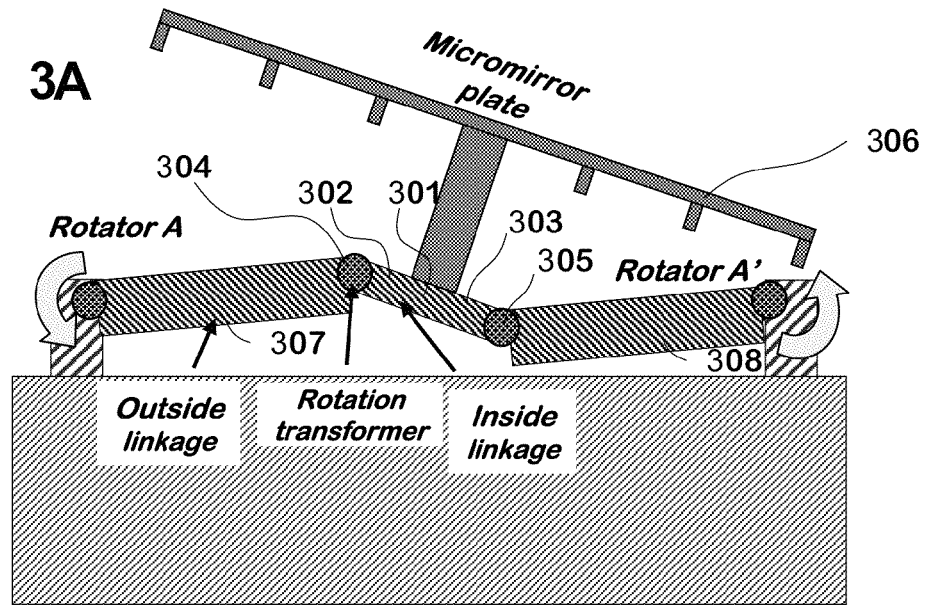
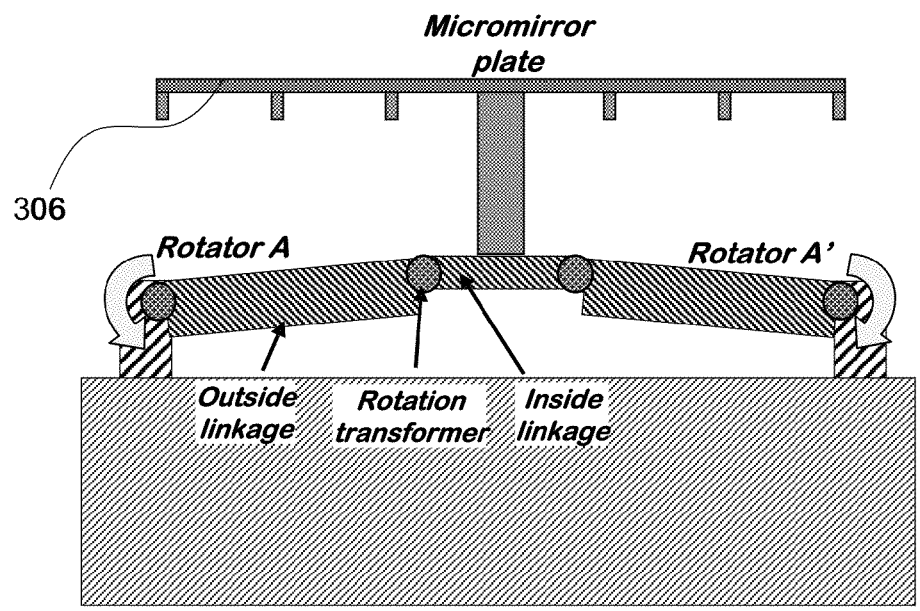
Fig. 3B

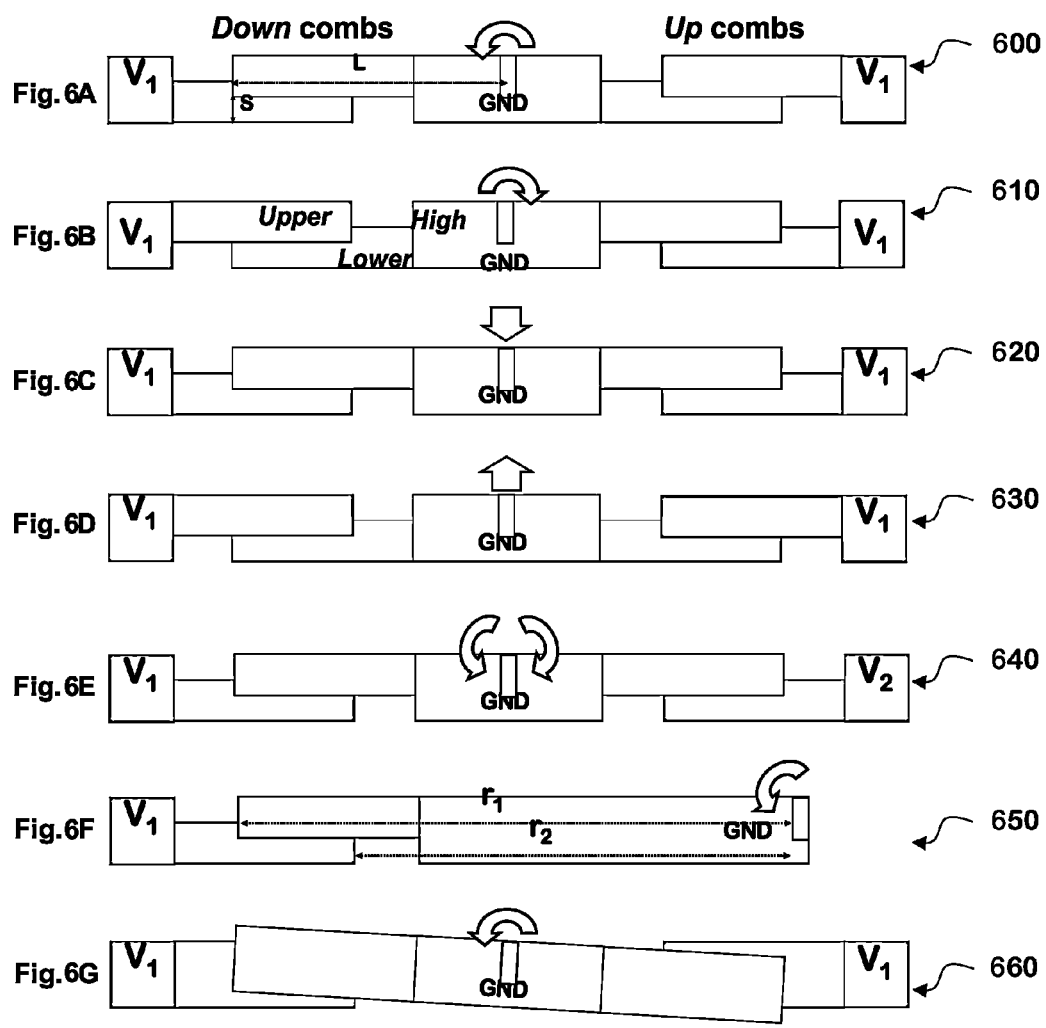

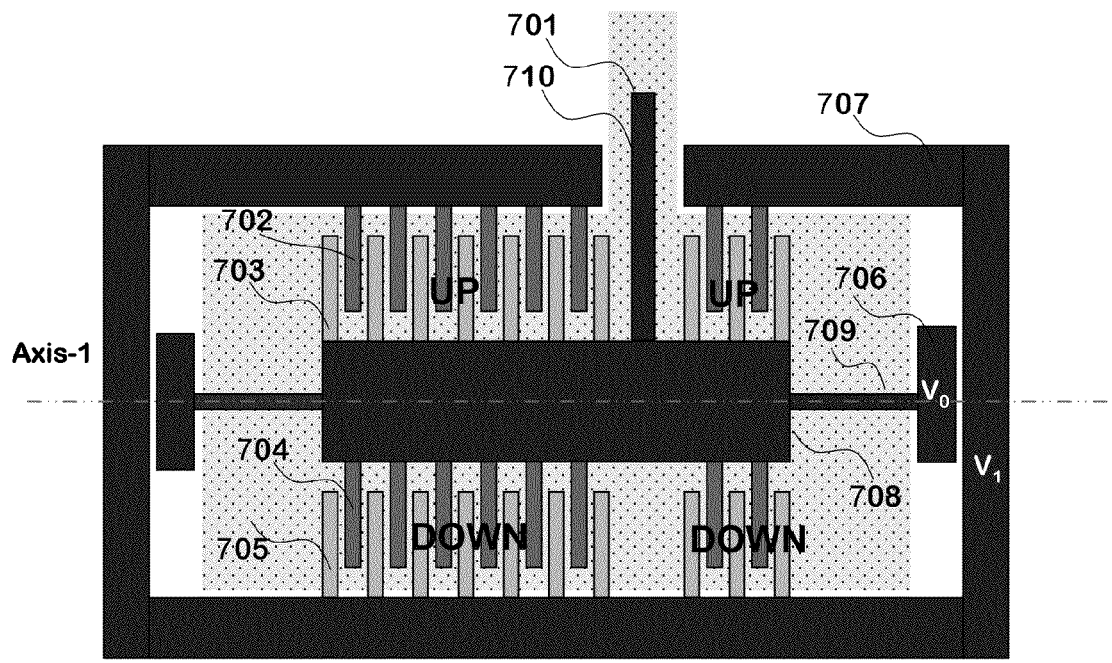
Fig. 7
Cavity    Lower    Upper    Full

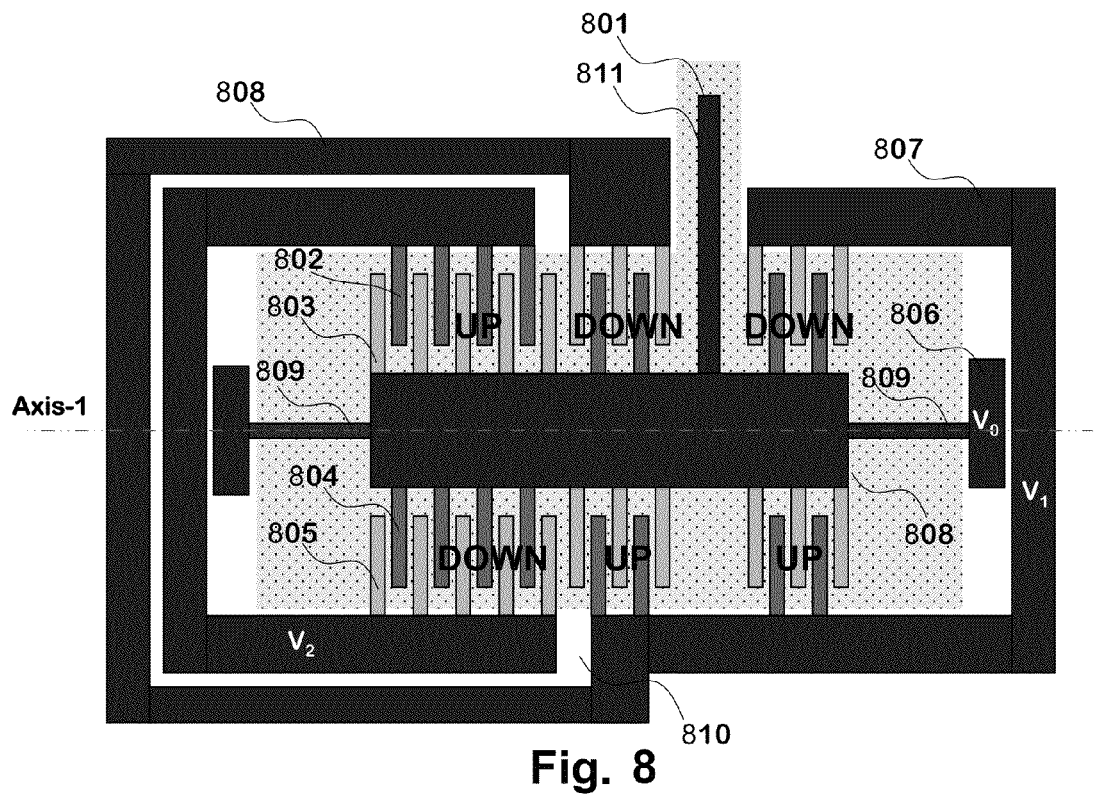
Fig. 8

Cavity | Lower | Upper | Full

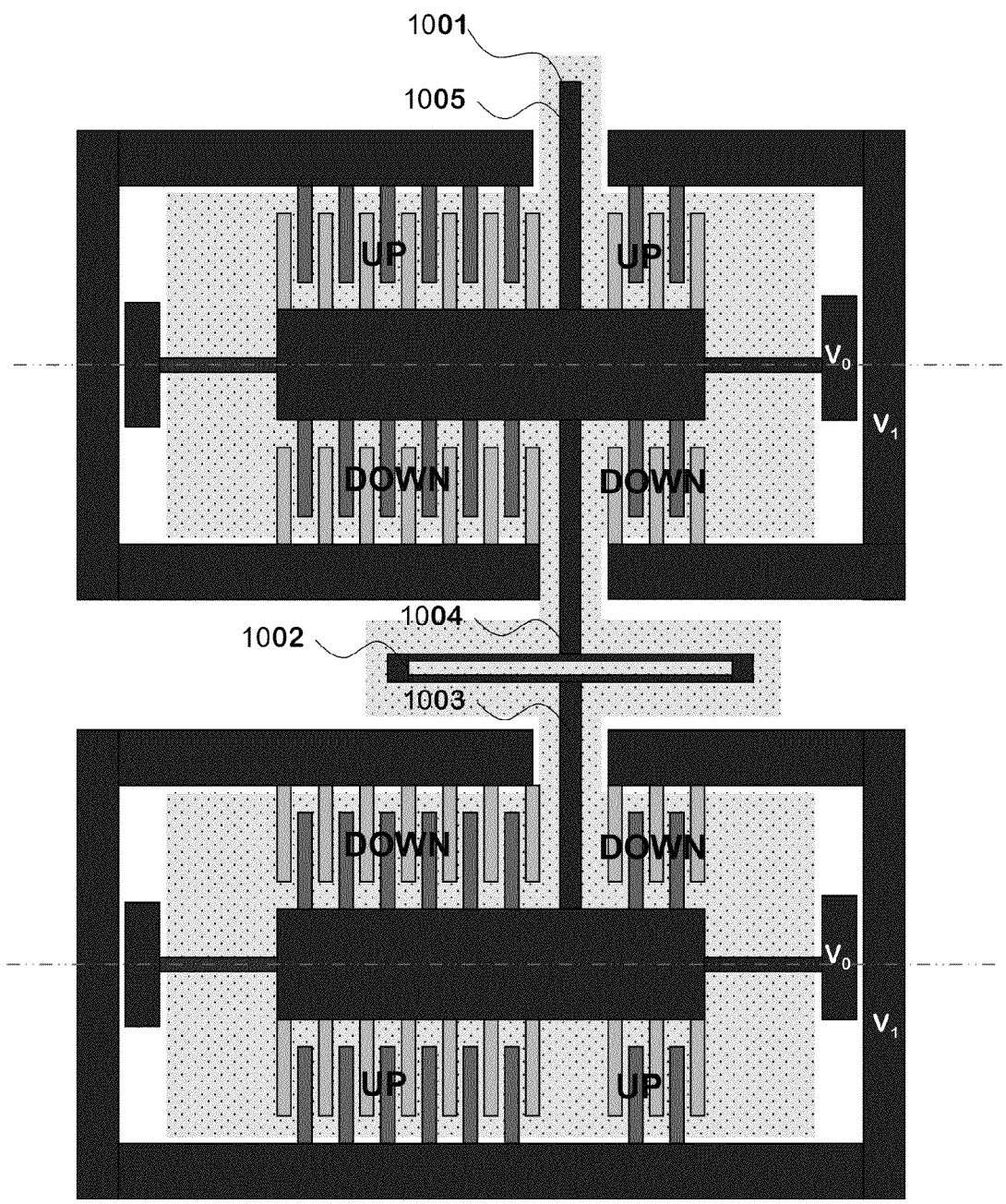
Fig.10

Lower  Upper  Full

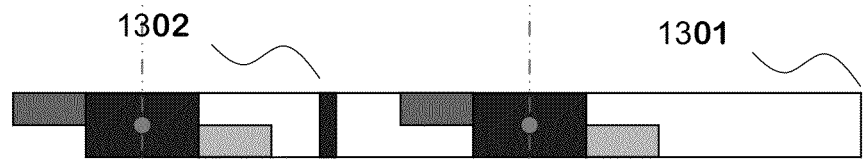
Fig. 13A
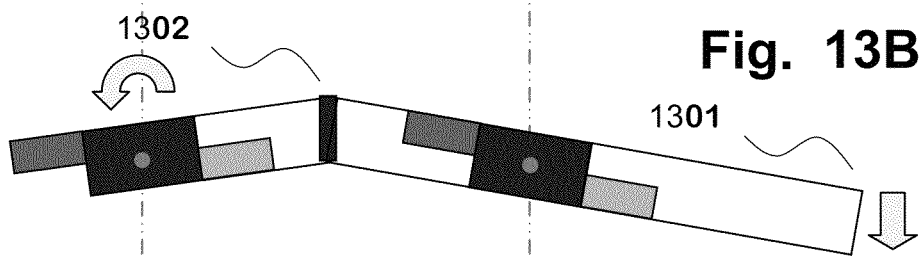
Fig. 13B
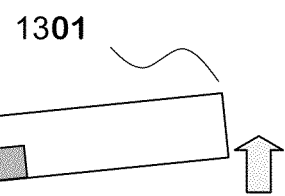
Fig. 13C
Lower   Upper   Full

Fig. 14A
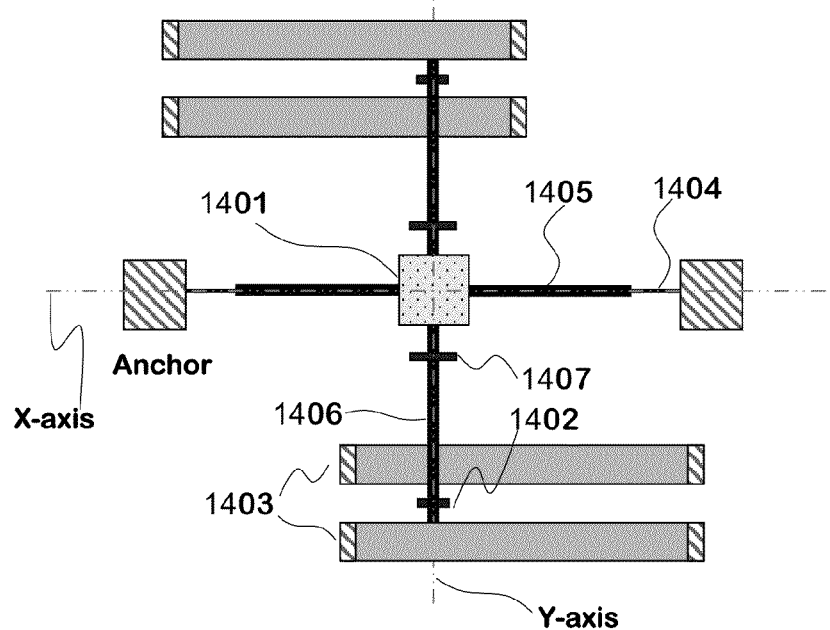
Fig. 14B
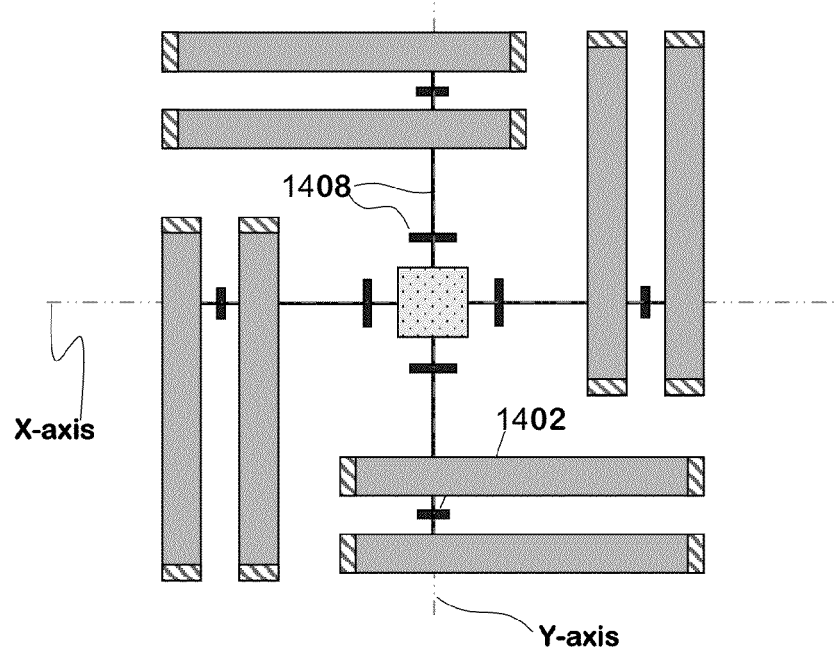
 Device Mount  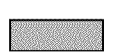 Rotator  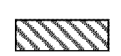 Anchor   Linkage

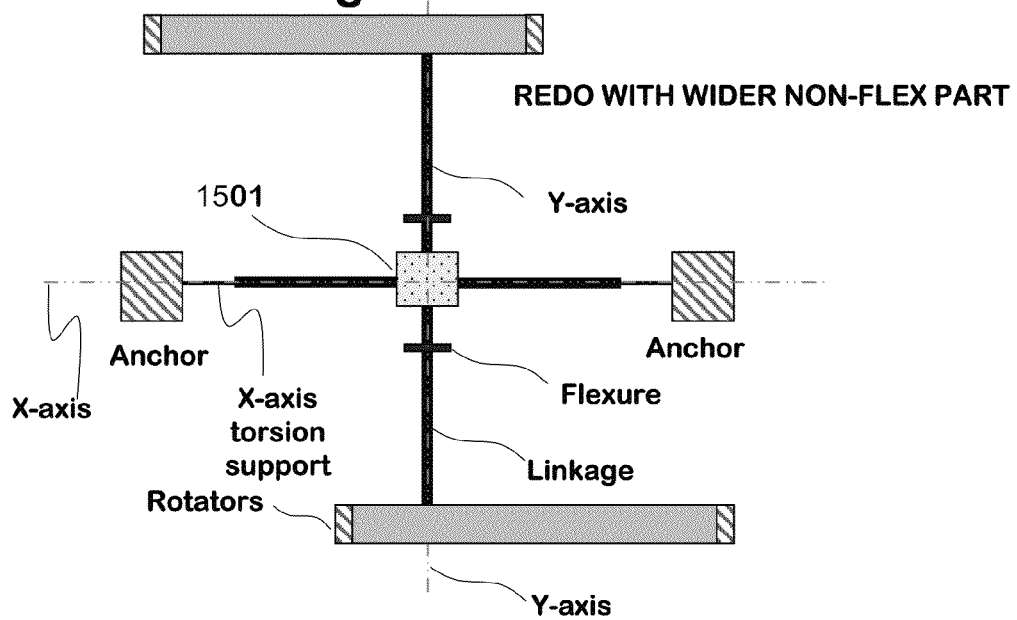
Fig. 15A
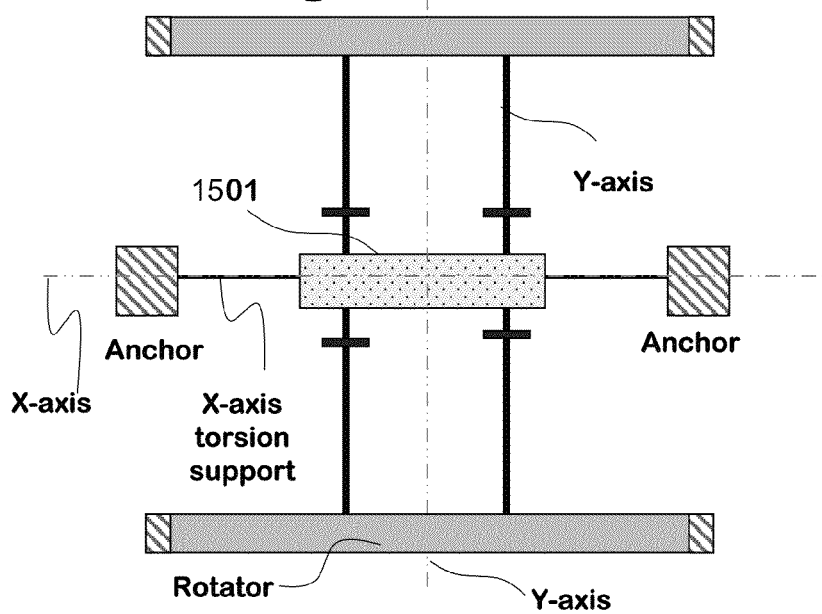
Fig. 15B

FEA modal simulation of tethered actuators

| Non-compliant beams | Compliant beams | 1st DoF rotation | 2nd DoF rotation |

Issue of unused area in a device where combining actuators can improve performance

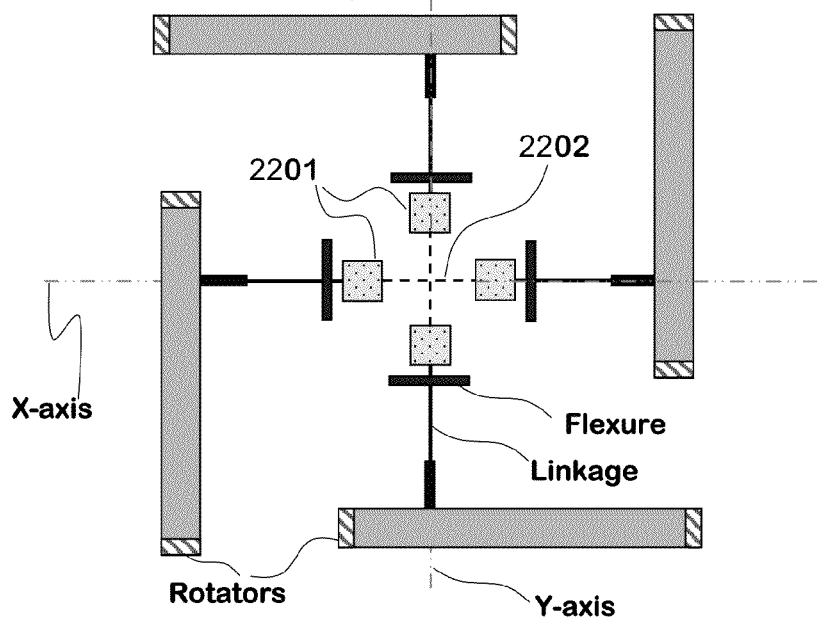
Fig. 22A
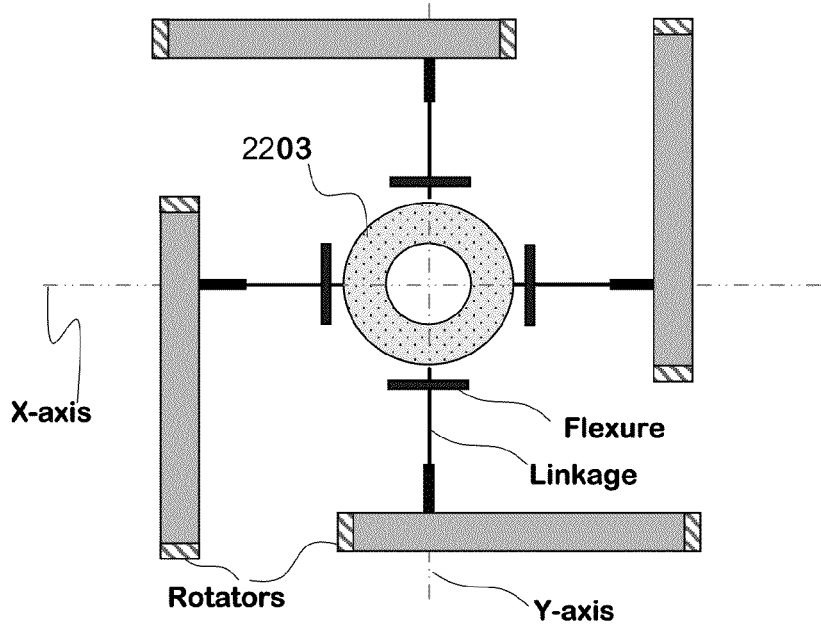
Fig. 22B

Singe/Center Pedestal

Multiple Offset Pedestals

Continuous (ring-shaped) Pedestal

Mirror attachment possibilities

MEMS ACTUATORS WITH COMBINED FORCE AND BI-DIRECTIONAL ROTATION

CROSS-REFERENCE TO RELATED APPLICATION

This application is a continuation-in-part of and claims the priority benefit of prior U.S. patent application Ser. No. 11/938,197, filed Nov. 9, 2007, now U.S. Pat. No. 8,043,513, the entire contents of which are incorporated herein by reference. U.S. patent application Ser. No. 11/938,197 is a division of and claims the priority benefit of prior U.S. patent application Ser. No. 11/003,271 filed Dec. 2, 2004, now U.S. Pat. No. 7,295,726, the entire disclosures of which are incorporated herein by reference. U.S. patent application Ser. No. 11/003,271 is a nonprovisional of and claims the benefit of prior U.S. provisional application No. 60/526,510 filed Dec. 2, 2003, the entire disclosures of which are incorporated herein by reference. This application is also a nonprovisional of and claims the priority benefit of prior U.S. provisional patent application No. 61/179,334 filed May 18, 2009, the entire disclosures of which are incorporated herein by reference.

FIELD OF THE INVENTION

Embodiments of the present invention relate to micro-electro-mechanical-system (MEMS) one-dimensional (tilt) rotation actuators, one-dimensional (piston) vertical actuators, two-dimensional rotation (tip-tilt) actuators, and three dimensional (tip-tilt-piston) actuators.

BACKGROUND OF THE INVENTION

A MEMS (Micro-Electro-Mechanical-System) device is a micro-sized electro-mechanical structure having fabricated by various microfabrication processes mostly derived from integrated circuit fabrication methods. Such a system may also include electronic circuits fabricated together with such a structure to perform a complete function, usually that of a sensor or an actuator. The developments in the field of micro-electromechanical systems (MEMS) allow for the bulk production of microelectromechanical scanning mirrors and scanning mirror arrays that can be used in all-optical cross connect switches, 1×N, N×N optical switches, variable optical attenuators, laser displays, bio-medical imaging, etc. A number of microelectromechanical mirror arrays have already been built using MEMS production processes and techniques. These arrays have designs that fall into approximately three design categories. A desirable component of many MEMS devices is an actuator that provides for either tip-tilt (2 degrees of freedom) or tip-tilt-piston (3 degrees of freedom) actuation.

Utilizing gimbaled structures is the most common method of implementing two-axis (two degrees of freedom, 2DoF) rotation, although packaging-based methods are utilized as well. However, to implement 2DoF gimbaled micromirrors without cross talk between driving voltages, electrical isolation and mechanical coupling is necessary. Backfilling of isolation trenches by depositing an additional dielectric layer and chemical mechanical polishing (CMP) has been used to achieve the electrically isolated mechanical coupling. However, the additional deposition and CMP steps significantly increase complexity and cost. Another viable method is to leave part of the handle wafer unetched beneath the gimbal structure. In all cases, complex fabrication has been required, and relatively low frequencies have been achieved due to the gimbals' slow outer axis. In applications where high speed static scanning is required the previous methods do not provide adequate solutions.

In single-axis and two-axis devices it is always important to increase torque (force) for rotation such that larger angles of rotation can be achieved or higher speeds can be attained by the device. If the individual rotating actuators can have more torque it will allow the designer to use stiffer support and torsion beams which will in turn increase the device bandwidth and resonant frequencies. Therefore we invented methods for combining forces of multiple actuators as well as methods for providing bi-directional torque within a single actuator. Further, we invented methods to further stabilize devices for desired axes of rotation, especially in the case of one-axis tilt devices.

Another focus of the designer of scanning mirror devices is flatness and stability of the reflecting mirror itself. Since this mirror may be fabricated separately from the actuator and then assembled (bonded) to the actuator, it is important to design each of them in such a way that upon final assembly the final unit has good mirror properties such as static flatness and minimal dynamic deformation.

It is within this context that embodiments of the present invention arise.

BRIEF DESCRIPTION OF THE DRAWINGS

FIG. 3A is a cross-sectional diagram of a micromirror device in which opposing rotation of each rotator results in rotation of the micromirror plate which is bonded onto the optical stage and is at a level above the actuators and linkages, according to an embodiment of the invention.

FIG. 3B is a cross-sectional diagram of a micromirror device in which common-mode rotation of each rotator results in vertical pistoning of the micromirror plate, according to an embodiment of the invention.

FIGS. 6A-6G are a series of cross-sectional diagrams depicting many combinations of vertical combdrive actuators as a result of the described fabrication steps according to embodiments of the invention.

FIG. 7 is a schematic diagram illustrating a uni-directional rotator.

FIG. 8 is a schematic diagram illustrating a bi-directional rotator.

FIG. 10 is a schematic showing force (or torque) amplification using two uni-directional actuators.

FIGS. 13A-13C are schematic diagrams showing side views of two uni-directional rotators connected by linking beams and a flexure.

FIG. 14A shows a top down schematic of a single axis device where the device mount can only rotate in the x-axis.

FIG. 14B shows a top down schematic of a two axis device where the device mount can rotate in the x-axis and y-axis, or the device mount can piston up and down (z-axis.)

FIG. 15A shows a top down schematic of actuator where the device mount at 1501 can only rotate along the x-axis.

FIG. 15B shows a top down schematic of a similar actuator where the device mount can only rotate along the x-axis.

FIG. 22A shows a two-axis gimbal-less actuator arrangements with multiple device mounts.

FIG. 22B shows a two-axis gimbal-less actuator with a continuous (ring-shaped) device mount.

DETAILED DESCRIPTION OF THE PREFERRED EMBODIMENTS

Figure 1A:
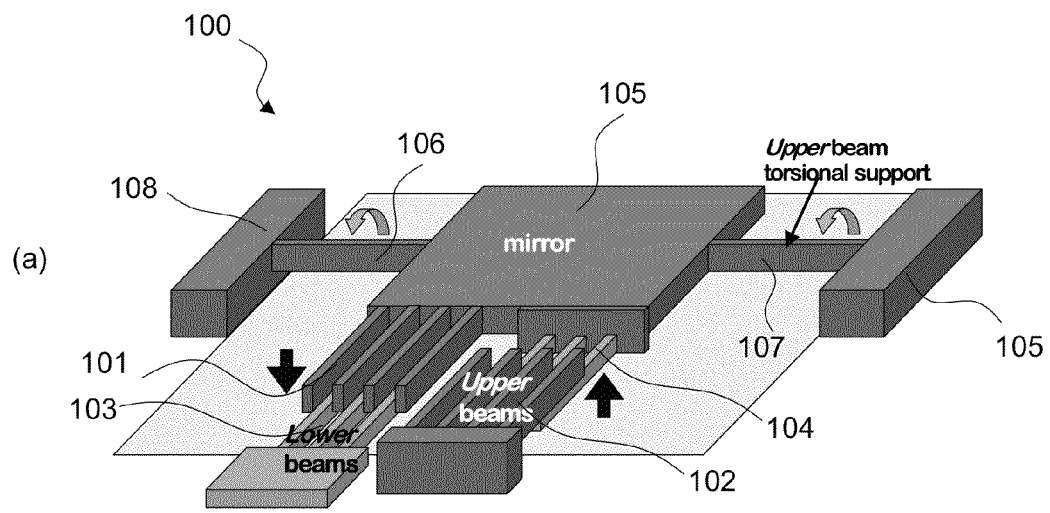
FIG. 1A shows a 3D schematic of a device that features up and down actuators and a mirror in the same rotator according to an embodiment of the invention.

The rotator as illustrated in FIG. 7 has Upper comb fingers illustrated in dark gray (702&704) at a higher out of plane position than Lower comb fingers illustrated by light gray (703&705). Controlling the rotator voltage $V_0$ (connected to anchor 706 & stage 708) and fixed combs' voltage $V_1$ (connected to electrode 707), exerts electrostatic forces between comb fingers 702 and 703 and between comb fingers 704 and 705 that tends to move drive beam 710 and load 701 up (out of plane of the schematic) from its resting neutral position. Only rotation in this 'up' direction is possible with this arrangement in a quasi-static sense (due to applied voltage.) Rotator 708 is tethered to anchors 706 via torsion springs 709 which allows the rotator to rotate along axis-1, but constrains the rotator from lateral or vertical translation and rotation in all other directions. This was shown in the cross-sectional schematic of a vertical combdrive actuator 610 in FIG. 6A. The same torsion springs provide restoring force that opposes combdrive force. All of the moving parts are suspended over a cavity that allows for rotation without mechanical limit. Anchors 706 and electrode 707 are anchored down to the underlying substrate and are not suspended over a cavity.

Controlled bi-directional movement can be achieved by providing two different combdrives arrangement, where each tends to rotated in the opposite direction as shown in FIG. 8. The rotator as illustrated in FIG. 8 has Upper comb fingers illustrated in dark gray (802&804) at a higher out of plane position than Lower comb fingers illustrated by light gray (803&805). Controlling the rotator voltage $V_0$ (connected to anchor 806 & stage 808) and fixed combs' voltage $V_1$ (connected to electrode 807), exerts electrostatic between comb fingers 802 and 803 and between comb fingers 804 and 805. Namely both the cross-sections of vertical combdrive actuators 600 and 610 of FIG. 6A and of FIG. 6B are included in the same rotator, and by applying voltages $V_1$ or $V_2$ on different portions of the fixed comb relative to $V_0$ applied to the rotator rotation in either direction is possible. $V_1$ controls the downward movement of drive beam 811 and load point 801, while $V_2$ controls the upward movement of drive beam 811 and load point 801. Combfingers attached to the portion of the rotator driven by voltage $V_1$ are arranged to give rotation that gives point 801 downward movement. Combfingers attached to the portion of the rotator driven by voltage $V_2$ are arranged to give rotation that gives point 801 upward movement. Space 810 between silicon structures powered by voltages $V_1$ and $V_2$ provides electrical isolation. Approximately ½ of the overall combdrive actuator provides upward movement of 801 and approximately ½ provides downward movement of 801, but this can be made asymmetric as well. Torsional suspension system illustrated by rotator 808 connected to anchor 806 via tether 809 allows for rotation along axis 1. All other directions of translation and rotation are constrained by the nature of these high aspect ratio torsion beams 809.

Figure 9:
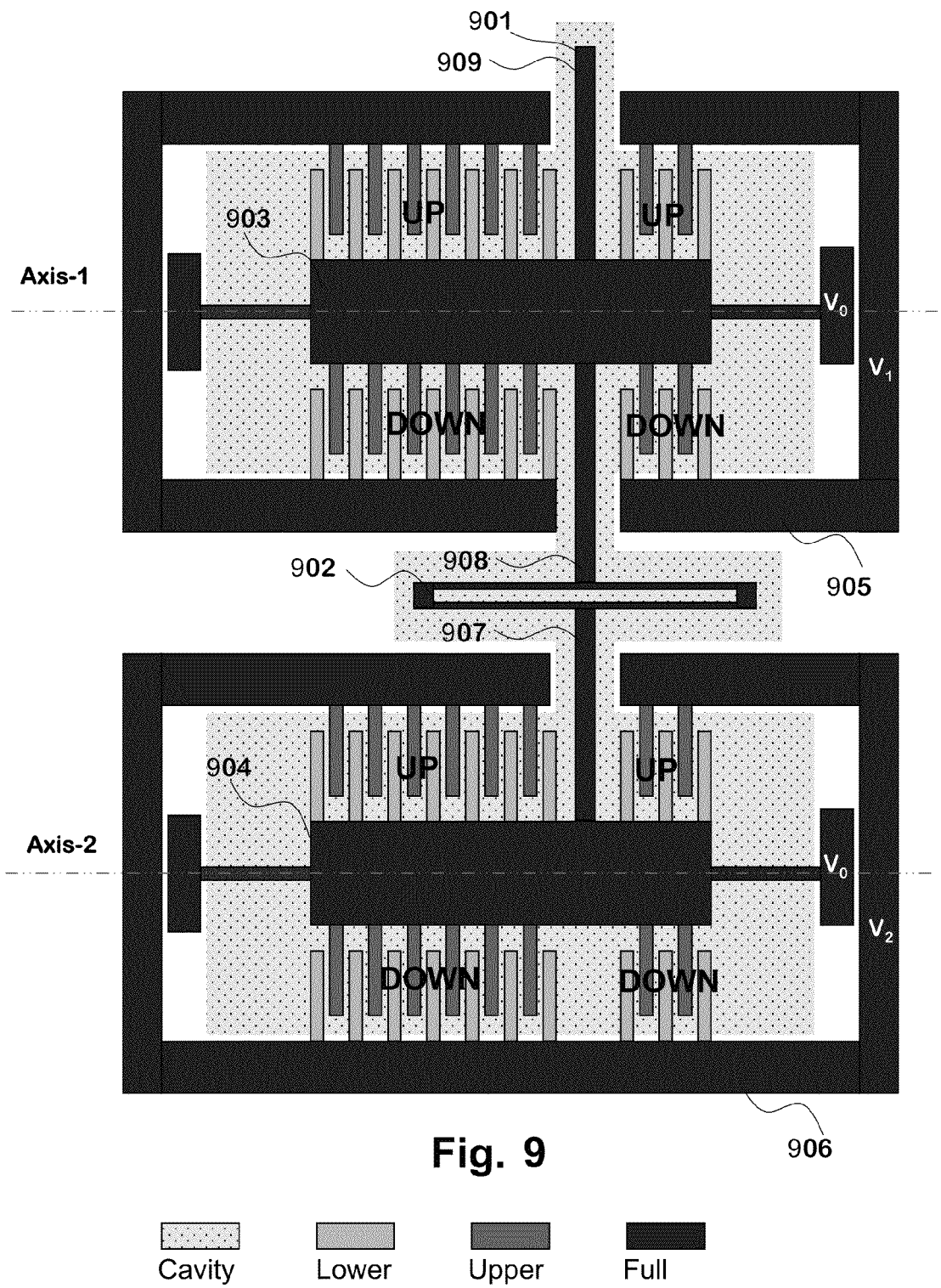
FIG. 9 is a schematic showing how bi-directional rotation can be achieved by linking two opposing uni-directional rotators.

Each uni-directional rotator here is designed in such a way to provide rotational torque, but in opposite directions as illustrated in FIG. 9. This is done by utilizing opposite combfinger cross-section, e.g. first rotator can use cross-section of FIG. 6A and the second rotator can use the cross-section of FIG. 6B. The top rotator is controlled by $V_0$ and $V_1$ while the bottom linkage is controlled by $V_0$ and $V_2$. Rotator 1 and 2 are connected by linking beams 907, 908 and a flexure at linkage 902. A variety of flexure designs may be used here which allow rotation and transfer load from one rotator to the next etc. Examples of possible flexures are shown in FIG. 17. $V_1$ applied to the top fixed combs 905 cause top rotator 903 to rotate along axis-1, which causes drive beam 909 and load point 901 to move up while linkage 902 moves down. Movement of linkage 902 causes bottom rotator 904 to rotate along axis-2. $V_2$ applied to the bottom fixed combs 906 will cause bottom rotator to rotate along axis-2, causing linkage 902 to move up. This in turn causes the top rotator 903 to rotate along axis-1, causing drive beam 909 and load point 901 to move down. Note axis-1 and axis-2 can be at any angle with respect to each other. Cross section schematic illustrating the movement of connected rotators are shown later in FIGS. 12A-12B and FIGS. 13A-13C.

This actuation strategy can be multiplied by connecting multiple actuators together, each subsequent actuator a mirror image of the previous and therefore their actions adding together to increase overall available actuator torque. The rotation axis of the rotators does not have to be parallel to each other, although space and manufacturability make parallel actuator an obvious choice. The rotators can be at multiple angles relative to each other and the force outputs will still add up, as long as they are not orthogonal (90 deg to each other.)

Comb drive or any capacitive actuators work on the principle that opposing charges attract. For the top actuator, it doesn't matter if $V_1 > V_0$ or $V_1 < V_0$, for the bottom actuator, it doesn't matter if $V_2 > V_0$ or $V_2 < V_0$. The attractive force between the fixed comb and rotating comb is proportional to $|V_1 - V_0|$ and $|V_2 - V_0|$. Bi-directional rotation can be achieved using two unidirectional directional rotator in this configuration by biasing the applied voltage $V_1$ and $V_2$. Positive voltage can be sent to the fixed comb of the top rotator while fixed comb on the bottom rotator gets 0V along with the moving comb drive on both rotators. This generates a rotation force on the top rotator causing drive beam 909 and load point 901 to go up. To make linkage 902 go down, negative voltage is send to the fixed comb of the bottom rotator, while the fixed on the top rotator gets 0V along with the moving comb drive of both rotator. By using differential voltage, a continuous positive to negative waveform such as a sine wave can drive the rotators in both directions, causing point 901 to move up and down. Diodes can be used to make sure that only positive voltage goes to fixed comb of top rotator, while only negative voltage goes to the bottom actuator.

FIG. 10 is a schematic showing force (or torque) amplification using two uni-directional actuators. The top and bottom actuators are mirror images of each other connected by linking beams 1003, 1004 and flexible linkage 1002. Applying voltage V1 will move linkage 1002 down, while drive beam 1005 and load point 1001 move up. This force amplification strategy can be extended by connecting more rotators via linkages 1002 and couplers. Again, the rotators can be at any angle relative to each other except orthogonal where their actions no longer add together. It should be noted that the linkage 1002 goes up and down vertically in a 'piston' motion which can also be utilized in some device designs and applications.

Figure 11:
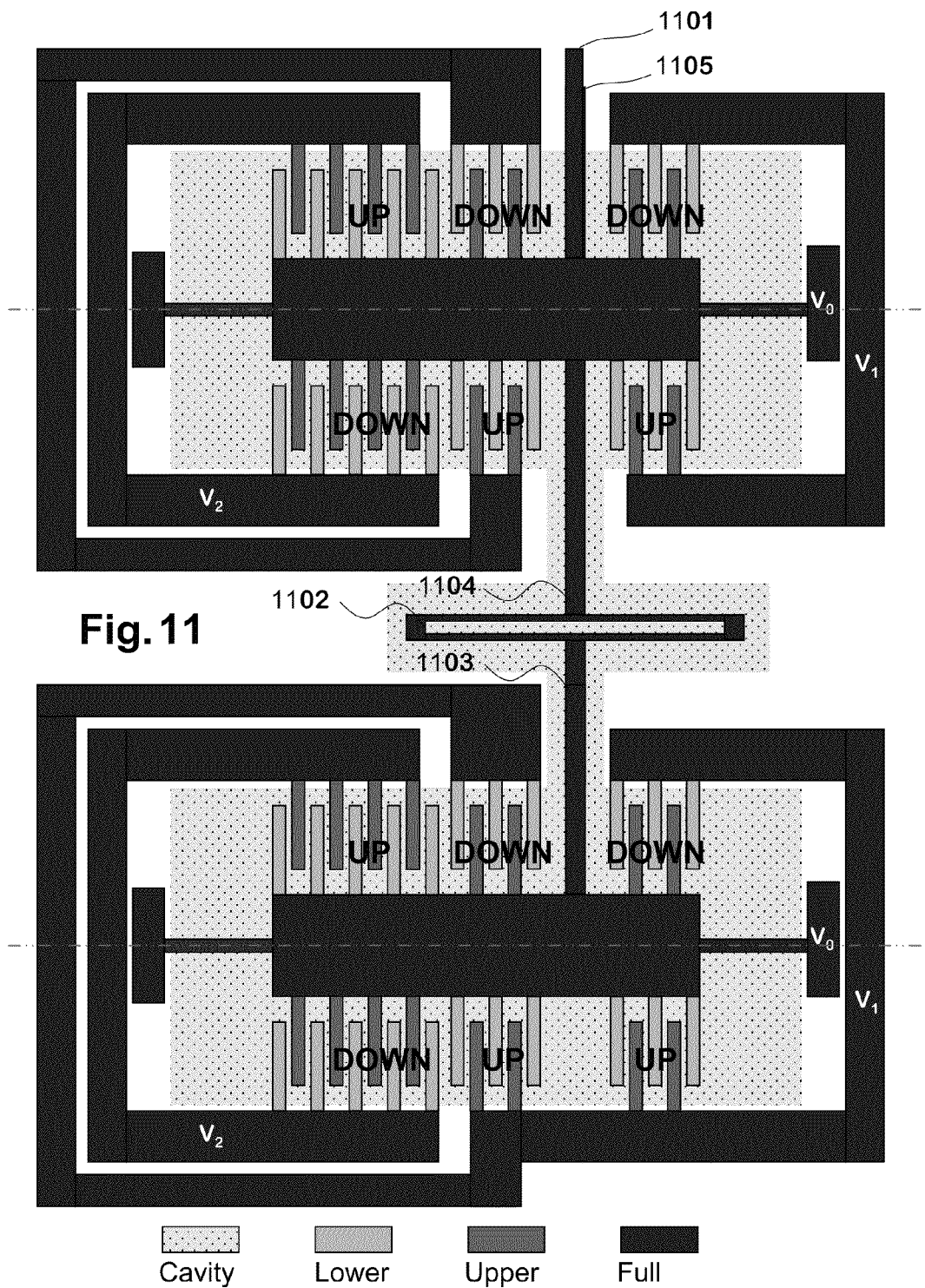
FIG. 11 is a schematic showing force amplification using two bi-directional actuators.

FIG. 11 is a schematic showing force amplification using two bi-directional actuators coupled by linking beams 1103, 1104 and flexible linkage 1102. This versatile design can achieve bi-directional movement and encompass actuation strategies illustrated in FIGS. 8-10. The top or bottom actuator can each individually achieve bi-directional movement of drive beam 1105 and load point 1101 independently. They can also work together to amplify their force output. Multiple actuators beyond two shown in the figure can be added to increase actuation force.

Figure 12A:
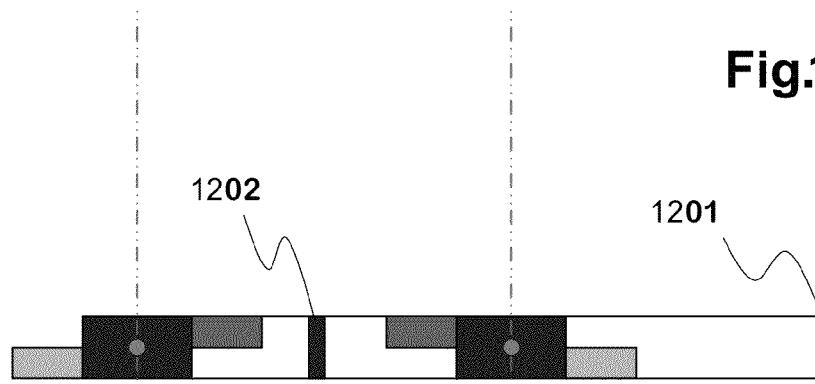
FIGS. 12A and 12B is a schematic showing side view of rotators combining efforts via linkages and couplers.
Figure 12B:
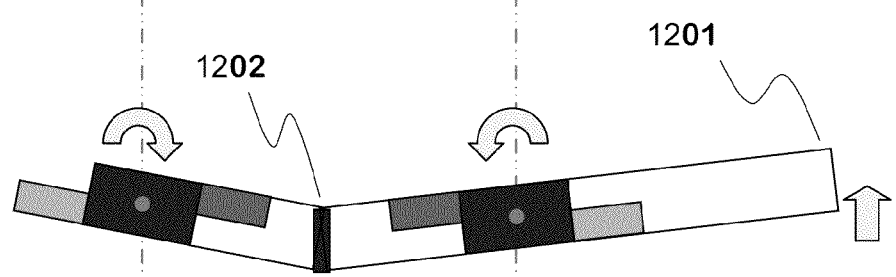

FIGS. 12A and 12B are schematics showing side views of rotators combining efforts via linkages and couplers. Counter clockwise rotation of right rotator causes point 1201 to move up. Clockwise rotation of left rotator causes coupler 1202 to move down, which aids the rotation effort of right rotator and therefore aids lifting of load point 1201 which can be attached to further actuator stages or an optical mount or mirror.

FIG. 13A is a schematic showing side view of two uni-directional rotators connected by linking beams and a flexible linkage 1302. This is a side-view illustration of FIG. 9-*achieving* bi-directional rotation by combining two uni-directional rotators. FIG. 13B illustrates the effect of counterclockwise rotation of left rotator; it causes flexure at point 1302 to move up and point 1301 to move down. FIG. 13C illustrates the effect of counterclockwise rotation of right rotator; it causes coupler at point 1302 to move down and point 1301 to move up. For the efforts of multiple rotators to add up, adjacent rotators need to rotate in opposite directions, while moving their connecting coupler in the same direction.

FIG. 14A shows a top down schematic of a single axis device where the device mount can only rotate in the x-axis. Motion of the device mount 1401 is constrained for rotation about x-axis by lateral anchors and torsion beams which connect those anchors to the device mount. Forces from multiple rotators can be combined by connecting them with linkages and flexures. In this schematic 2 rotators 1403, connected together by linking beam 1402 and connected to the device mount 1401 by a flexible linkages 1407, are shown on each side of the device mount, all together providing torque for rotation of the device mount against various restoring spring forces, achieve bi-directional movement of drive beam 1405 and load point 1404 independently. The rotators can be uni-directional or bi-directional as described earlier in FIGS. 8-10. The rotators can be oriented at any angle with respect to each other. Some may be uni-directional while some bi-directional.

FIG. 14B shows a top down schematic of a two axis device where the device mount can rotate in the x-axis and y-axis. Force from multiple rotators can be combined by connecting them with linkages and flexures. The rotators can be uni-directional or bi-directional as described earlier in FIGS. 8-10. The rotators can be oriented at any angle with respect to each other.

FIG. 15A shows a top down schematic of actuator where the device mount at 1501 can only rotate along the x-axis. Bi-directional movement can be achieved by any actuation strategies described earlier. Undesired movement of the stage, in the x, y, z (out of plan) direction, as well as any unwanted rotation or wobbling can be reduced by tethering the stage to fixed anchor points. The tether is compliant in rotation, allowing for the actuators and linkages to rotate the stage along the x-axis.

Figure 16A:
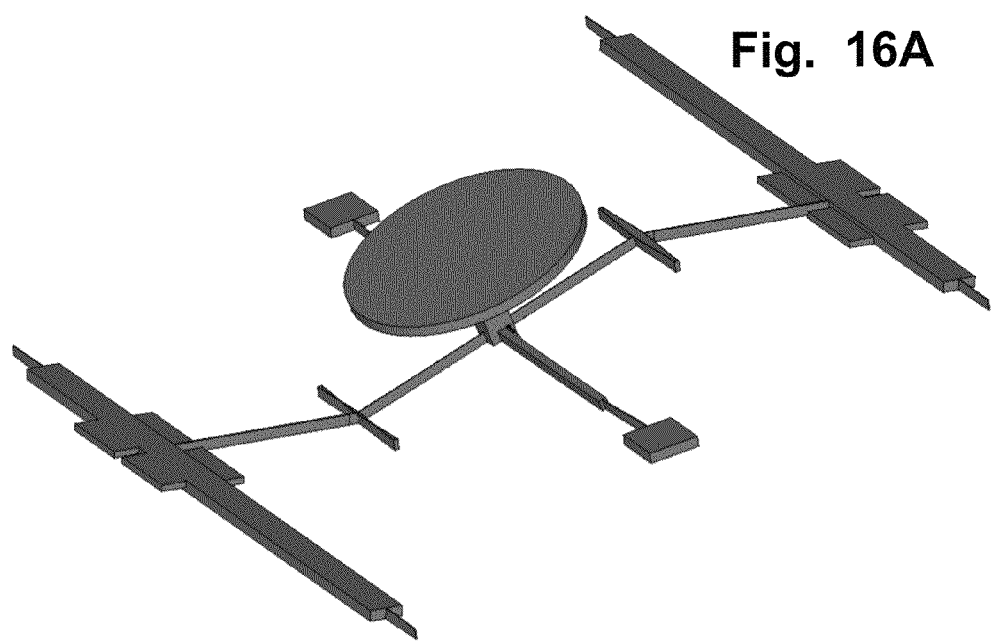
FIG. 16A shows a finite element (FEA) simulation of the desired x axis rotational mode of a tethered single-axis actuator.

FIG. 15B shows a top down schematic of a similar actuator where the device mount can only rotate along the x-axis. However, the device mount is rotated by two sets of linkages and flexures, which makes the assembly more rigid and less excitable in undesirable modes FIG. 16A shows a finite element (FEA) simulation of the desired x axis rotational mode of a tethered single-axis actuator. A mirror is bonded to the device mount with a pedestal stand-off which provides the necessary clearance for the mirror with respect to the underlying actuator.

Figure 16B:
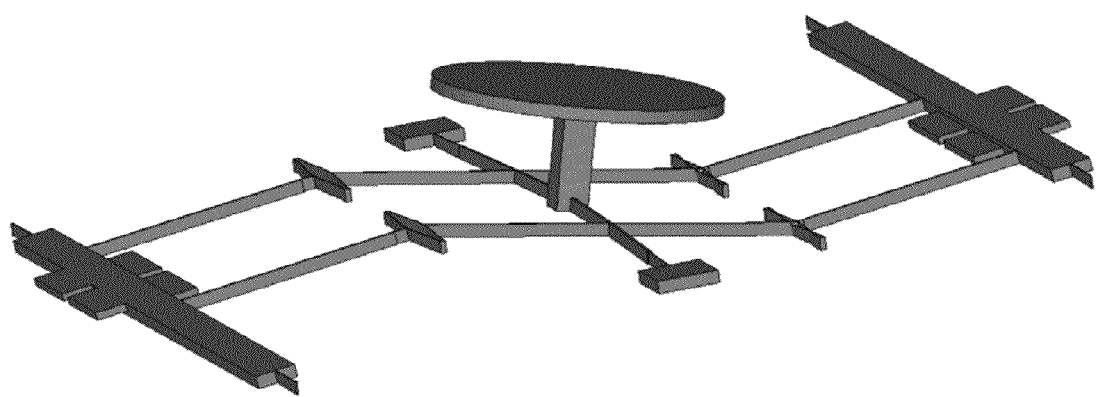
FIG. 16B shows the desired x axis rotational mode of a tethered actuator with two sets of linkages and flexures.

FIG. 16B shows the desired x axis rotational mode of a tethered actuator with two sets of linkages and flexures.

Micromachined silicon micro-structures do not perform well as proper joints that are often used in large scale mechanisms. To obtain devices that perform the function of joints such as is needed in the implementation of the actuation methods described in this invention (e.g. FIGS. 13A-13C and FIGS. 15A-15B,) mechanical flexures may be designed in such a way that they have a preferred axis of compliance, i.e. are substantially more compliant for bending or rotation in one direction, but are relatively stiff in other directions. Examples of several different of arranging flexure beams to from such a joint are illustrated in FIGS. 17A-17G.

Figure 17A:
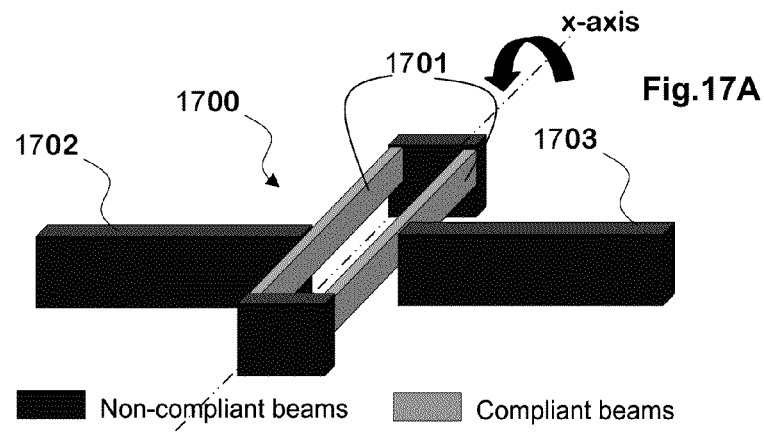
FIG. 17A is a 3D schematic of a 1 DoF linkage that can be micromachined from a single monolithic piece of substrate.

FIG. 17A is a 3D schematic of a monolithic piece of silicon substrate which is micromachined in such a way that it forms a 1DoF (one-axis) linkage 1700. The linkage 1700 has non-compliant beams 1702 and 1703 (large dimensions,) and compliant flexure beams 1701 (narrow dimensions) which have a preferred compliance in torsion. Therefore this linkage can be bent around the x-axis with substantially less force than in any other directions and can serve as a 1DoF "joint."

Figure 17B:
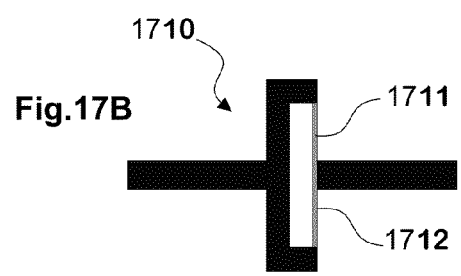
FIG. 17B-17G is a series of plan view schematics of various possible 1 DoF linkages that can be micromachined from a single monolithic piece of substrate.

FIG. 17B-FIG. 17G are plan view diagrams of various possible arrangements of stiff and compliant beams to achieve the above mentioned one-axis "joint" effect. In FIG. 17B, the one-axis linkage 1710 has two torsionally compliant flexure beam elements 1711 and 1712. Because they are arranged in parallel in this layout, and have same dimensions, the overall stiffness in the desired axis rotation of linkage 1710 is twice the stiffness of element 1711.

Figure 17C:
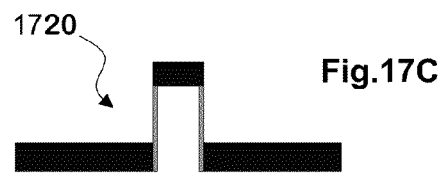

Linkage 1720 in FIG. 17C has two flexure beam elements connected in series and therefore, the overall stiffness in the desired axis rotation of linkage 1710 is one half the stiffness of one element.

Figure 17D:
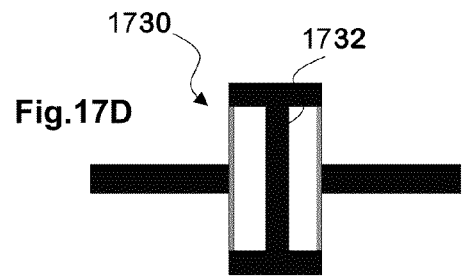

Linkage 1730 in FIG. 17D has two flexure beam elements connected in series which are in parallel with another pair of elements which are in series. It is nearly equivalent to two linkages 1710 in series. Therefore, the overall stiffness in the desired axis rotation of linkage 1730 is the stiffness of one element.

Figure 17E:
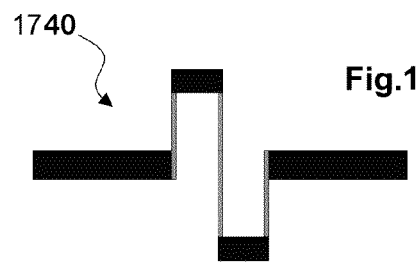

Linkage 1740 in FIG. 17E has four flexure beam elements connected in series and therefore, the overall stiffness in the desired axis rotation of linkage 1740 is one quarter of the stiffness of one element.

Figure 17F:
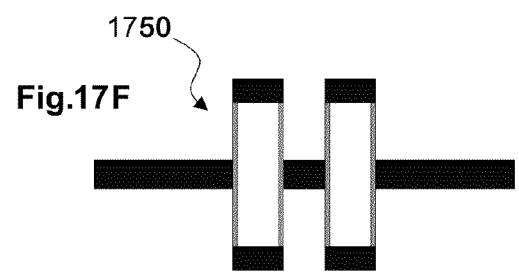

Linkage 1750 in FIG. 17F is nearly equivalent to four linkages 1710 in series, and therefore the overall stiffness in the desired axis rotation of linkage 1750 is ½*stiffness of one element.

Figure 17G:
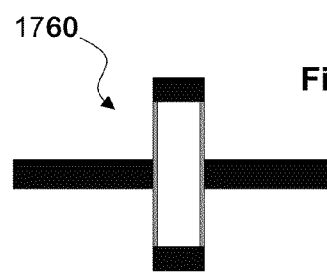

Linkage 1760 in FIG. 17G has two elements connected in series, which are in parallel with another pair of elements which are in series. It is nearly equivalent to two linkages 1710 in series. This is the plan view schematic of the linkage 1700. Therefore, the overall stiffness in the desired axis rotation of linkage 1730 is the stiffness of one flexure beam element.

Linkage 1730 utilizes a central stiff beam support 1732 unlike similar linkage 1760. In the desired mode of x-axis rotation both linkages perform substantially equally. However, linkage 1730 is substantially less compliant to any axial forces, which tend to "squeeze" the joint together or pull the joint apart. Linkages 1720, 1740, 1750, 1760 are not designed for axial stiffness but allow stretching of the linkage on axis of the stiff elements 1702 and 1703.

The tip-tilt and tip-tilt-piston actuators of the present invention, where 1 DoF rotators are used to actuate a central device mount in two-axis, require a more complex linkage than the simple 1 DoF loops and buckles described earlier. Namely, to take 1 DoF rotation from the rotators, but allow 2 DoF (tip-tilt) or 3 DoF (tip-tilt-piston) of the central device mount, the linkage need to be a 2 DoF minimum linkage (at least bi-axial.) This only applies to desired degrees of freedom, i.e. the purposefully designed compliances in the linkage. Clearly, any linkages designed in the micromachined silicon structures will have many other degrees of freedom of significantly higher order and resonant frequency that we can consider them as substantially stiff and negligible in the present discussion and nominal device operation.

Figure 18A:
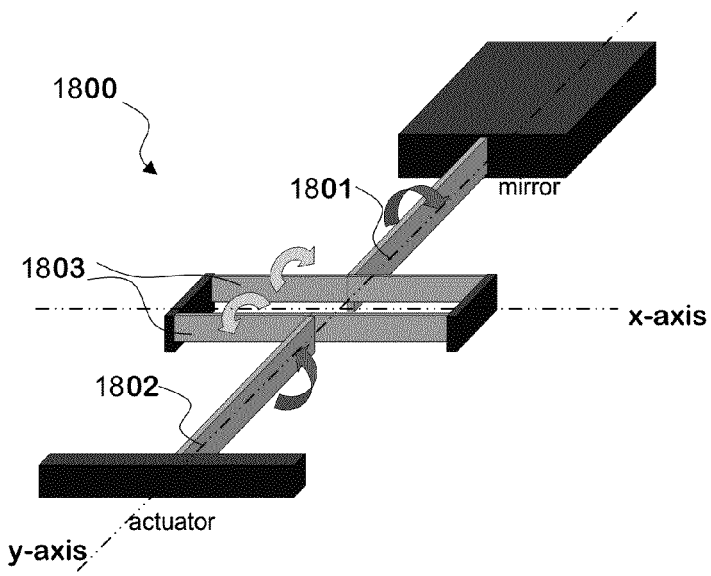
FIGS. 18A-18B and FIGS. 19A-19B are series of 3D schematics of various 2 DoF linkages that can be micromachined from a single monolithic piece of substrate.

FIG. 18A illustrates one preferred embodiment 1800 of the bi-axial (2DoF) linkage in the present invention. All the beams are placed substantially equal to the uni-axial (1DoF) linkage 1700. Therefore rotation of the linkage about the x-axis is provided by the torsional compliance of the beams 1803. In addition, to enable rotation of the actuator or the mirror about the y-axis, either one or both beams 1801 and 1802 are designed to be torsionally compliant.

Figure 18B:
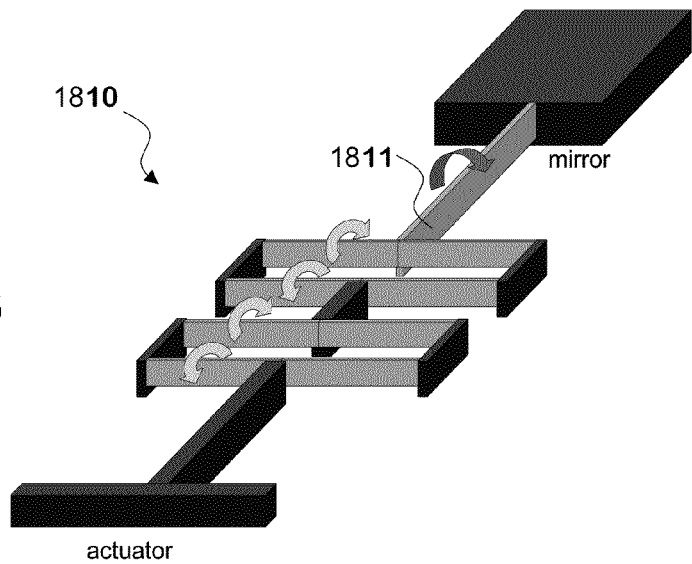

Bi-axial linkage 1810 in FIG. 18B employs series arrangement of x-axis beams shown in linkage 1750 of FIG. 17F. In addition, y-axis beam 1811 is designed to be compliant for torsion about the y-axis giving the overall bi-axial compliance in two orthogonal axes. If the actuator is held at the end of the linkage and is prevented from moving, the tip-tilt-piston 3DoF of motion can be applied to the mirror end to a substantially large degree without breaking the linkage. In addition, upon removing the force on the mirror, it will restore into original position due to the beams restoring force.

Any beam arrangements that provide for the 2 DoF in the mirror and transfer the rotator's rotation to the parallel axis in the mirror can be used. In certain embodiments of the invention described herein an important feature is a bi-axial linkage having two flexure beams, each configured to flex about a different (non parallel) axis. The restriction is to try to design the linkage so as to minimize any other compliances to modes that are undesired, which basically result in mirrors in-plane (lateral) movement, or mirrors vertical translation (when piston mode is not desired.) For tip-tilt embodiments of the invention, any mode that does not result in rotation of the mirror about it's gravity center are undesired and should be avoided by proper linkage design—and by utilizing opposing rotators on the other side, as depicted in the complete gimbal-less actuators of FIG. 20 and FIGS. 22A-22B.

Figure 19A:
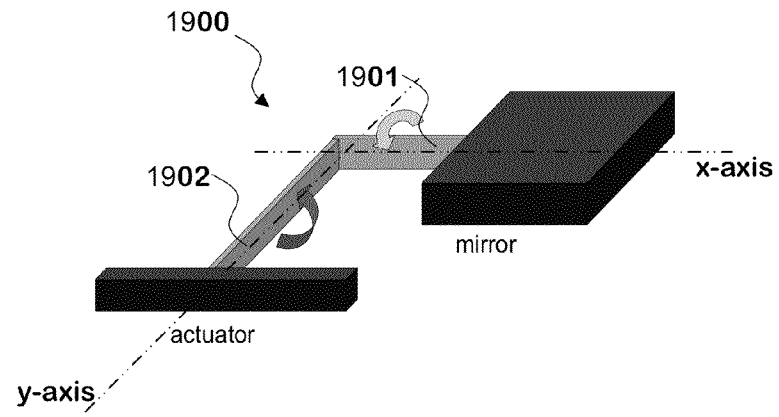

FIG. 19A shows a 3D schematic diagram of one more possible embodiment of the bi-axial linkages of the present invention. Linkage 1900 of FIG. 19A utilizes a simple L-shaped arrangement of torsionally compliant beams 1901 and 1902 such that beam 1901 allows mirror's rotation about the x-axis while beam 1902 allows rotation about the mirror's y-axis.

Figure 19B:
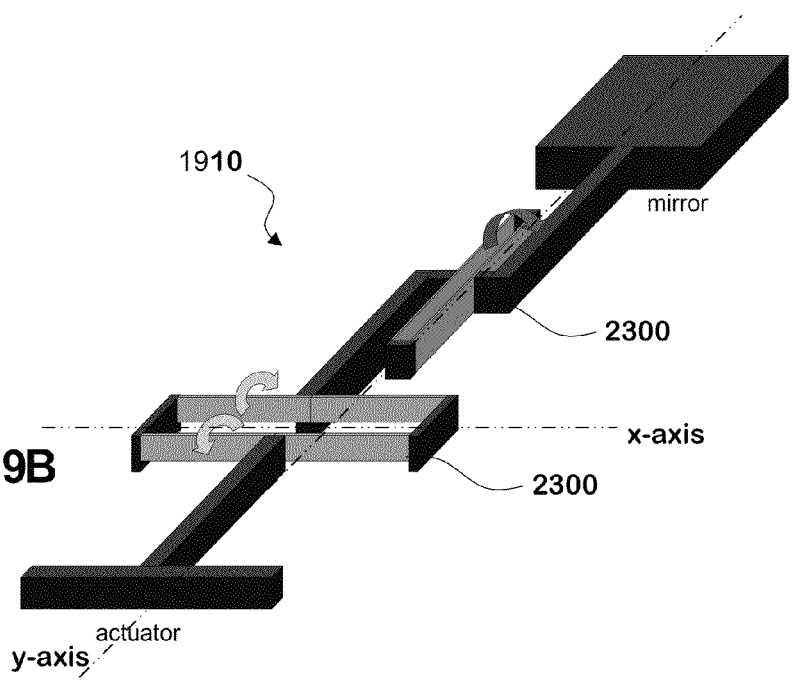

FIG. 19B shows a 3D schematic diagram of yet another possible embodiment of the bi-axial linkages of the present invention. Linkage 1910 of FIG. 19B utilizes two uni-axial (1DoF) linkages 2300 of the type depicted from FIG. 17A which are placed orthogonally to each other to allow mirror's rotation about the x-axis or the y-axis.

As noted above, mirror flatness and stability are often important considerations in the design of MEMS devices. New methods for designing additional mirror supports to enhance its flatness but in such a way that there is a minimal increase of inertia that would lower the speed of the overall device are shown. According to another embodiment, new mirror pedestal arrangements have been developed that provide multiple supports or a larger continuous support to the mirror surface. These multiple pedestals then attach to multiple points within the actuator die, for example to each individual rotator in an assembly. This means that the actuator die may have multiple mirror/device mounts and that the mirror structure may have multiple or continuous pedestals.

Figure 20:
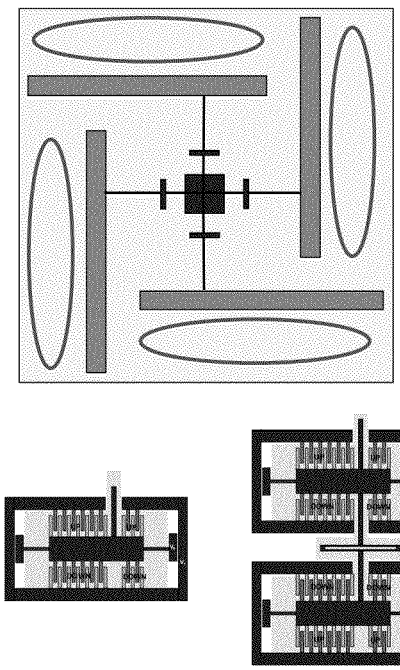
FIG. 20 shows an SEM of a two-axis gimbal-less actuator with four rotators and a bonded 1.2 mm diameter micromirror and a schematic of this arrangement. Areas of the silicon die which are not used are outlined in red. A schematic of proposed combining of rotators to provide additional torque is also shown which could fill the unused die area and increase performance.

As mentioned before, it is desirable to increase actuator size to increase available torque for device mount rotation. Therefore it would be more optimal to utilize more silicon die area, either by increasing the die size or by improving the utilization of a given die area. FIG. 20 shows an SEM of a two-axis gimbal-less actuator with four rotators and a bonded 1.2-mm diameter micromirror. A schematic of this arrangement is also shown and in both figures areas of the silicon die which are not used are outlined by ellipses. A schematic of a proposed arrangement that combines rotators in a way that provides additional torque is also shown which could fill the unused die area and increase performance.

Figure 21A:
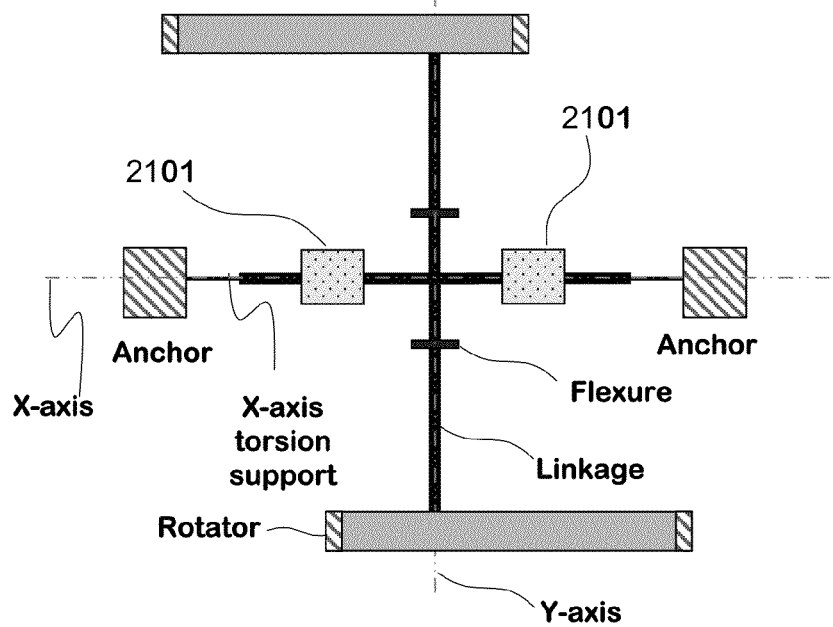
FIGS. 21A-21B show one-axis actuator arrangements with multiple device mounts.
Figure 21B:
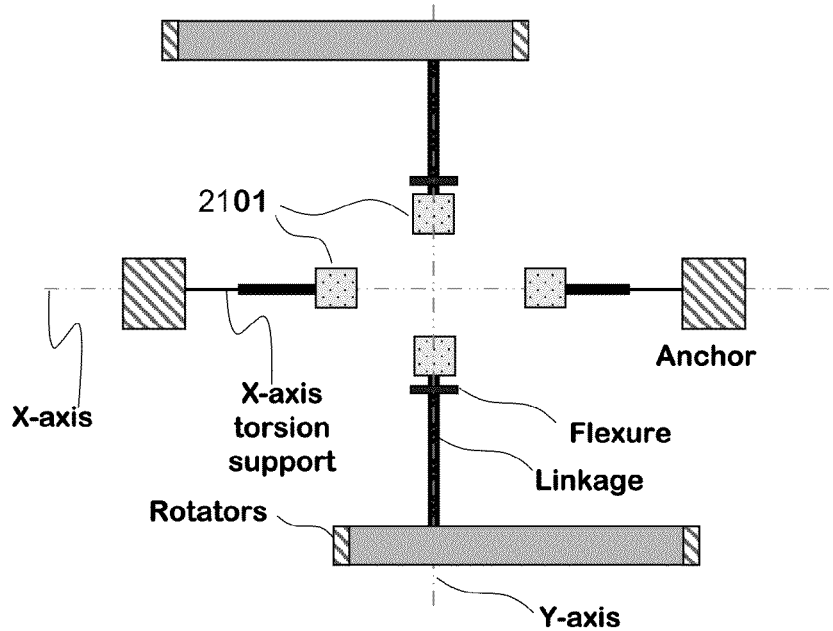

FIG. 21 describes one-axis actuators with different arrangements of device mounts other than device mounts in the center as in FIGS. 14-16. Embodiments of the invention may utilize multiple device mounts 2101 such as in FIG. 21A to allow multiple assembly points for a single device (e.g., a mirror) or in other embodiments to allow multiple mirrors or devices to be mounted. The arrangement in FIG. 21B with four separate device mounts suggests that if a device is such as a reflecting mirror, is assembled into such an actuator, the device itself will provide a connection between the rotators. Therefore the device mounts are disconnected in this embodiment.

Figure 23A:
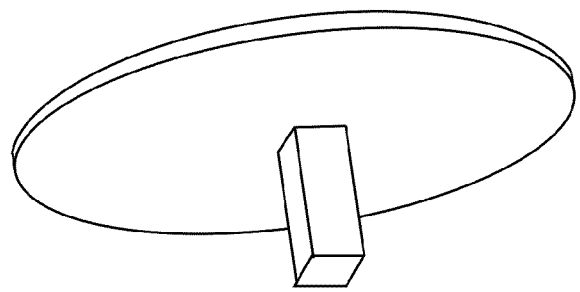
FIGS. 23A-23C show different possible pedestal (stand-off) arrangements for a mirror which allow the mirror to be bonded/assembled onto actuator device mounts. Single pedestal is shown in A, multiple pedestals are shown in B, and a continuous (ring-shaped) pedestal is shown in C.
Figure 23B:
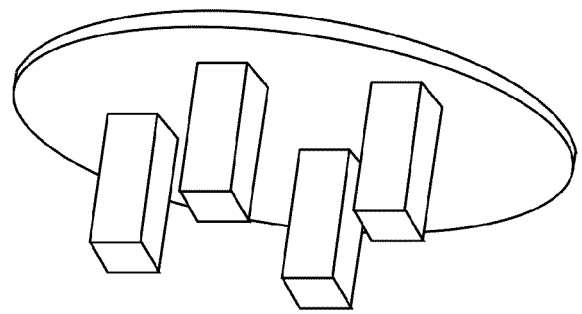
Figure 23C:
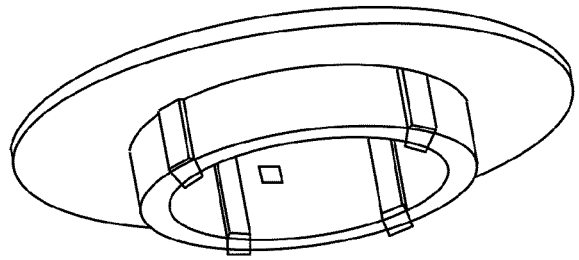
Figure 24A:
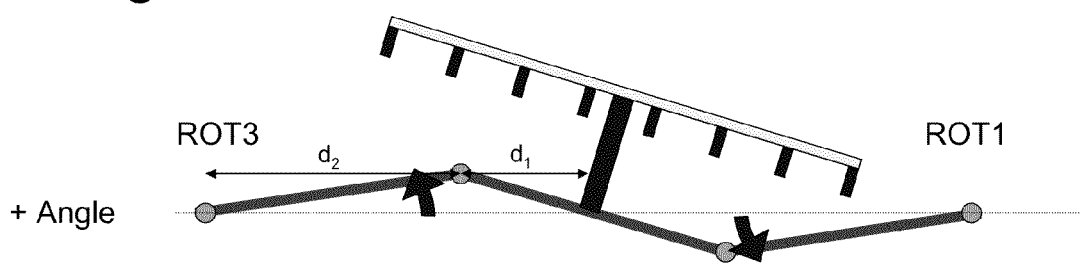
FIGS. 24A-24B are schematic depictions of mirror mounting/assembly options for the cases where a single device mount and pedestal are used (A) and the case where multiple device mounts and pedestals are used.
Figure 24B:
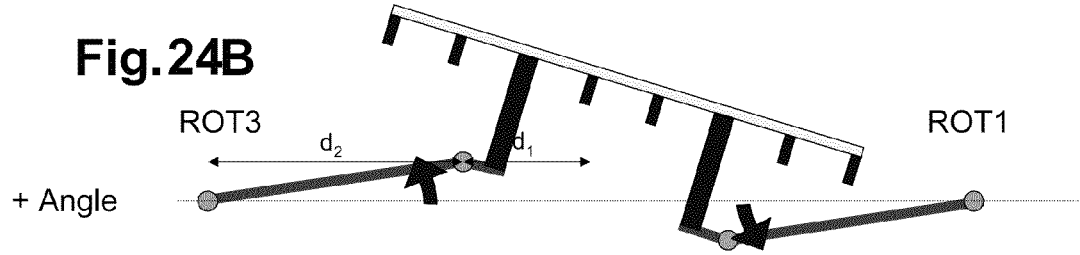

Similarly, in a two-axis actuator case or tip-tilt-piston actuator case where there are 2 or more rotators a single device mount, multiple device mounts, or continuous device mounts may be utilized. FIG. 22A is a two-axis gimbal-less actuator where each bi-axial linkage attaches to a separate device mount 2201. If a mirror 2202 with four separate pedestals such as that of FIG. 23B is attached to the device mount, a complete tip-tilt device is formed. Connection between the rotators is provided in the mirror device itself. This is also shown schematically in FIG. 24 in a cross-sectional view. However linkages 2202 may also be used to connect the device mounts within the actuator itself, for easier fabrication and less stress imparted on the bonded device. This arrangement again gives us an advantage of being able to mount several separate devices, e.g. multiple mirrors. FIG. 22B has a continuous ring-shaped device mount 2203 which may be optimal for mounting mirrors with a matching ring-shaped pedestal, e.g. FIG. 23C. This provides additional support for the mirror and improves its static flatness and reduces any dynamic deformation. It can be clearly seen that the single-pedestal arrangement of FIG. 23A has the least strongly supported mirror plate which could therefore potentially have most deformation due to reflecting film stress or dynamic stresses. On the other hand multiple pedestals of FIG. 23B or a continuous pedestal of FIG. 23C provides significant additional support for the mirror plate while not dramatically increasing inertia.

Embodiments of the present invention may utilize a combination of one-axis vertical comb-drive based rotation actuators and bi-axial mechanical linkages that allow 2DoF of rotation (tip-tilt,) or 3DoF of motion (tip-tilt-piston) for a central structural support for an optical element such as a micromirror. The comb-drive actuators can by themselves achieve >20° of static optical deflection at frequencies of up to several kHz (with a 600 µm diameter and 30 µm thick silicon micromirror attached to the support). Such a configuration can effectively decouple the problem of two-axis scanners and can independently optimize and approach the problem of improving one-axis rotators, as well as the linkages that form the overall 2DoF structure. While many embodiments described herein use comb-drive rotators to produce the actuation of the central support, the design can also utilize pure vertical actuators, gap-closing electrodes or piston actuators.

The basis of the fabrication methodology is that a monolithic substrate of single crystal silicon (or similar material, SiGe or SiC, polysilicon, metallic depositable materials, etc.), e.g. a single-crystal silicon wafer with double-side polished front- and back-side, can be etched from the front-side and from the back-side in an aligned fashion to form three-dimensional electro-mechanical structures.

Also as shown in FIG. 1A, various arrangements of upper beams 101, 102 and lower beams 103, 104 produce comb-drives that provide downward force or upward force. FIG. 1A depicts a device 100 where both combdrives are utilized side by side such that one combdrive or the other can be actuated and thereby achieve bi-directional rotation of an optical component such as a mirror 105 that is connected by flexure beams 106, 107 to anchors 108, 109. The mirror 105 is connected to a common potential (e.g. GND) while one static end of each combdrive as the counter-electrode. The mirror 105 may be made of silicon and plated with a metal such as gold, copper, aluminum or chrome or any combination thereof.

Figure 1B:
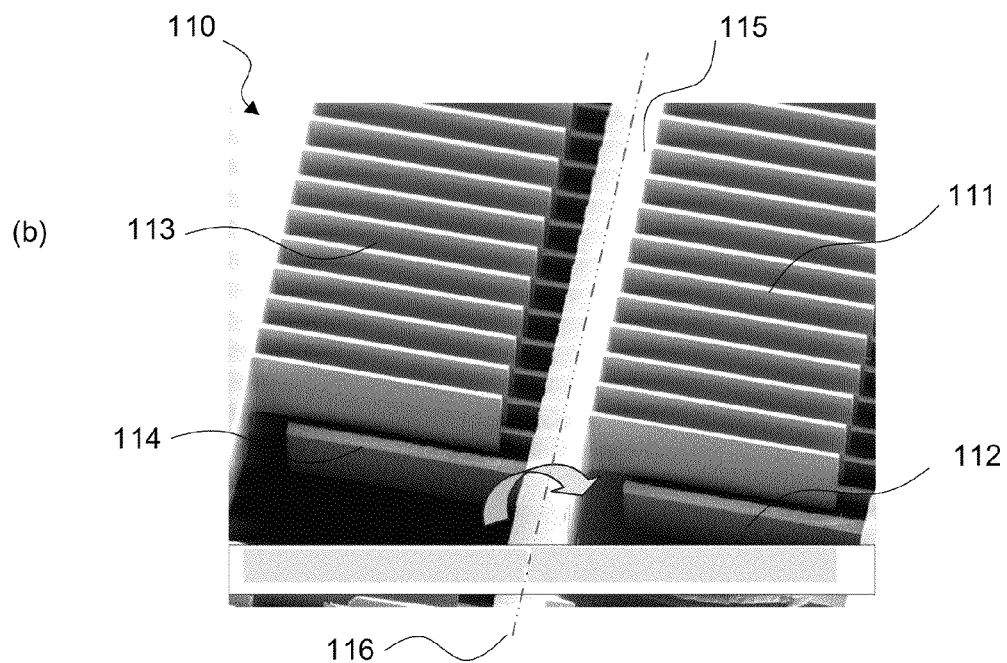
FIG. 1B is a SEM micrograph of a balanced rotator according to an embodiment of the invention.

FIG. 1B is a SEM micrograph of a balanced rotator device 110 with the preferred arrangement of combdrives to achieve substantially pure rotation. A shuttle 115 is suspended by two torsional supports not seen in the figure and can be moved by electrostatic forces on the combdrives. Combfinger sets 111 and 114 are attached to the shuttle 115 and are therefore moving combfingers. Combfinger sets 112 and 113 are fixed combfingers. The combdrive made of combfingers 111 and 112 is therefore a downward-force combdrive. The combdrive made of combfingers 113 and 114 is therefore an upward-force combdrive. By combining a downward force combdrive with an upward force combdrive on opposite sides of the rotation axis 116 (axial to the shuttle 115), and actuating both simultaneously, lateral and vertical translational forces are substantially cancelled. However, the torque from each side is combined in the same direction of rotation (clockwise for device 110 as shown in FIG. 1B)

Figure 2:
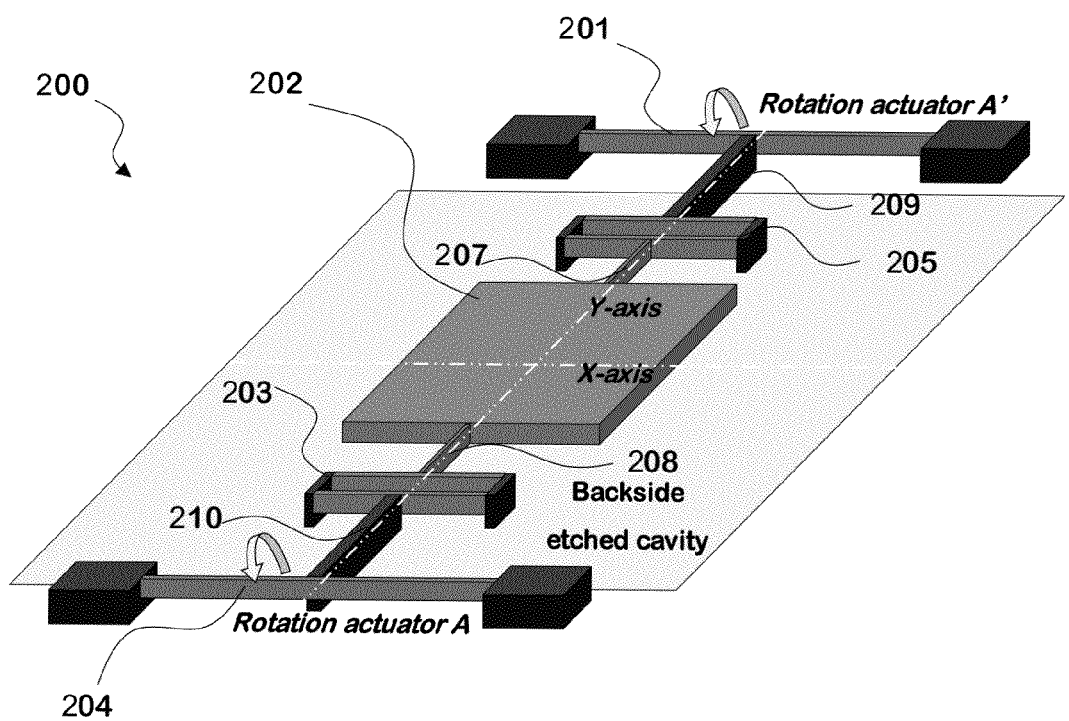
FIG. 2 is a 3D schematic of a one axis micromirror device with two rotators, two 1 DoF linkages and a mirror plate according to an embodiment of the invention.

As a step toward implementing gimbal-less two-axis devices, one-axis devices such as the device 200 depicted in the 3D schematic of FIG. 2, have been developed. The device 200 generally includes a micromirror plate 202 connected to rotation actuators 201, 204 via inside flexure beams 207, 208, rotation transformers 203, 205 and outside flexure beams 209, 210. All of these components may be fabricated from the same device layer, e.g., as described above. In particular, the rotations may be combdrive actuators of any of the types described above. One or both of the rotation transformers 203, 205 includes a flexure beam that allows rotation of the mirror plate 202 with respect to an X-axis. One or more of the flexure beams 207, 208, 209, 210 may include a beam that allows rotation of the micromirror plate 202 with respect to a Y-axis that is non-parallel (e.g., perpendicular) to the X-axis. To illustrate the principle of operation only a single pair of actuators 201, 204 that impart rotation about the X-axis are shown.

The device 200 operates based on the methodology shown in the cross-sectional schematics of FIG. 3A and FIG. 3B. Two rotating actuators A, A' are placed in parallel and arranged to rotate in the same direction (e.g., counter clockwise, as shown in FIG. 3A). A device mount 301 is connected to the actuators A, A' by inside flexure beams 302, 303 rotation transformers 304, 305 and outside flexure beams 307, 308. All of these components may be formed from the same device layer. Note that in FIGS. 3A-3B, a micromirror plate 306 is attached to the device mount 301. As the rotators A, A' rotate counterclockwise the outside flexure beams 304, 305 and inside flexure beams 307, 308 impart an opposing action. Namely, although both rotators can be of balanced rotator type for "pure" rotation, the attachment of the linkage determines whether the linkage is therefore rotated up or down. The rotator A on the left in FIGS. 3A-3B actuates its outside flexure beams 307 up, while the rotator A' on the right actuates its flexure beams 308 down. As a result, the inside flexure beams 302, 303 effectively achieve rotation in the opposite (clock-wise) direction from the actuators A, A'. By the help of the linkages which act as transformers of rotation and are 1 degree of freedom (DoF) flexures, actuator rotation displaces the inside flexure beams 302,303 in opposite directions and rotates the mirror 306 clockwise. Since the outside flexure beams 307, 308 and inside flexure beams 302, 303 experience the same vertical motion at the end of the transformer, the linkage rotation is inversely proportional to its length. Therefore, the ratio of actuator and mirror rotations can be scaled by changing the ratio of lengths of the inside flexure beams 302, 303 and corresponding outside flexure beams 307, 308. As explained above, for vertical combdrive actuators, vertical comb drive stroke is limited by the device layer thickness and is given as $S/r_1$. By scaling the flexure beams lengths however, it is possible to drive mirrors to rotation angles well beyond the rotational range of the actuators. This mechanical gain feature is explained in more detail below.

Figure 4A:
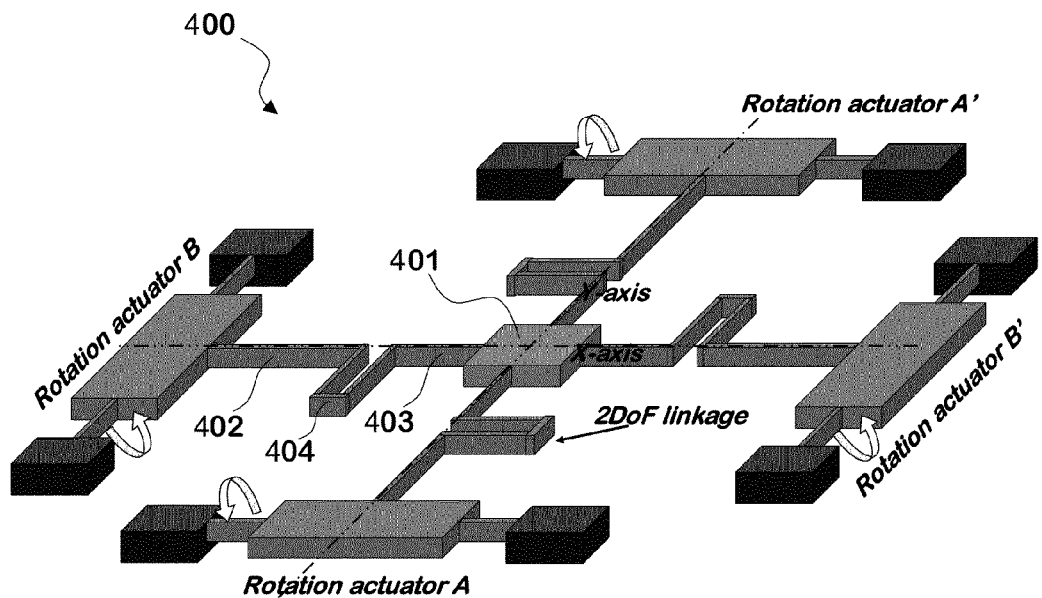
FIG. 4A is a 3D schematic of a two-axis non-gimbaled actuator with four rotators, four linkages, and an optical stage or mirror plate at the same level as the actuator and linkage according to an embodiment of the invention.
Figure 4B:
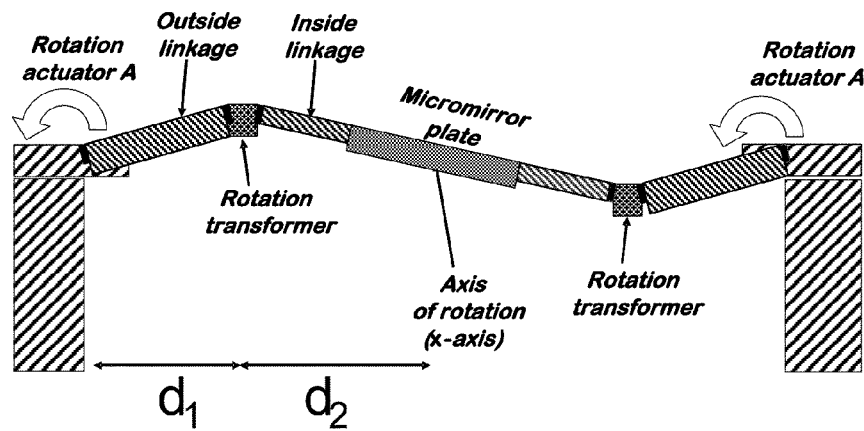
FIG. 4B is a cross-sectional diagram of the embodiment of the invention in FIG. 12A in which opposing rotation of each rotator results in rotation of the micromirror plate.
Figure 5A:
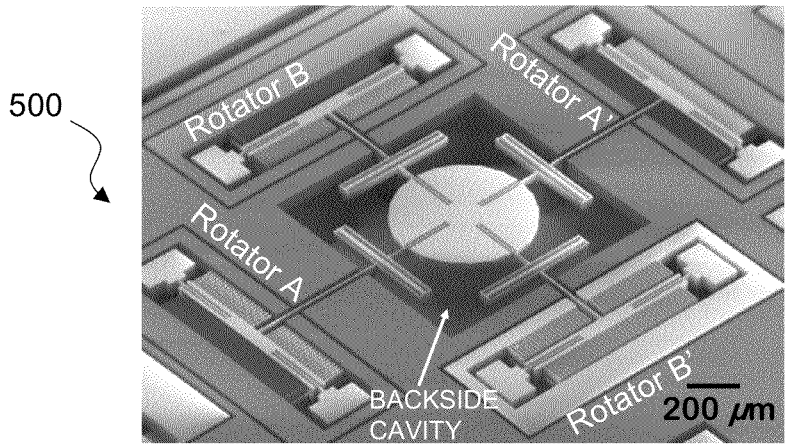
FIG. 5A is an SEM micrograph of an embodiment of the invention using four rotators which surround the micromirror on four sides, to scan in two axes.
Figure 5B:
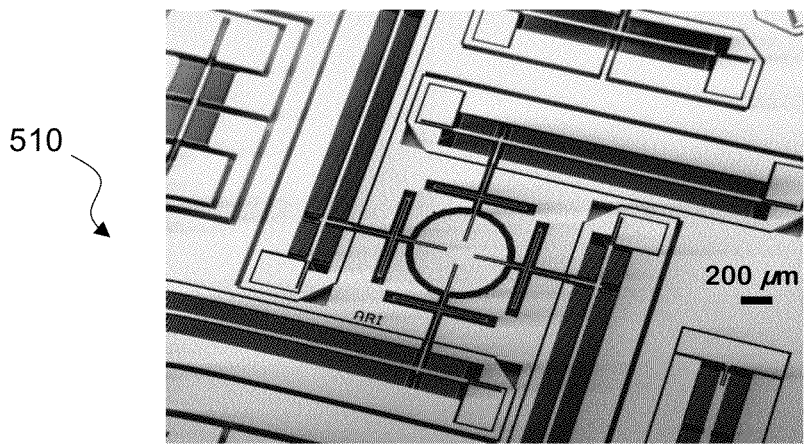
FIG. 5B is an SEM micrograph of an embodiment of the invention with an arrangement of rotators in such a way that they may extend to any desired length without crossing.
Figure 5C:
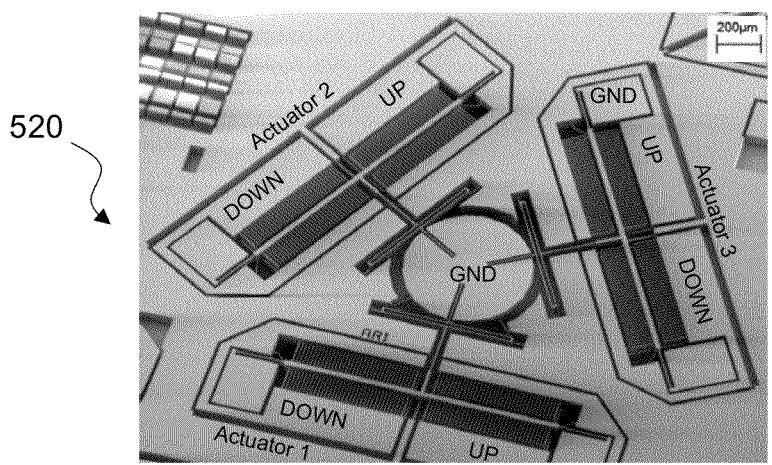
FIG. 5C is an SEM micrograph of an embodiment of the invention with three bi-directional balanced rotators to scan an integrated micromirror in 3 DoF, tip tilt and piston.

To achieve the goal of fast two-axis scanning, one can combine multiple one-axis rotators positioned orthogonally, as depicted in FIGS. 4A-4B, and utilize 2DoF mechanical linkages to allow two-axes of rotation for a central device mount or micromirror. The problem is how to combine one-axis scanners of the types discussed above, and allow the operation of one scanner about one axis to be nearly independent of the operation of another scanner about another (non-parallel) axis. The proposed solution is schematically shown in FIG. 4A, and fabricated as devices 500, 510, 520 depicted respectively in FIGS. 5A-5C. Specifically, two one-axis rotators are utilized for each axis of the overall 2D scanner. For the x-axis, actuators A and A' are utilized, and for the y-axis, actuators B and B'. The actuators may be combdrive actuators of any of the types described above. Each actuator is attached to a device mount 401 (e.g., a mirror or stage) through a set of flexure beams 402, 403 and a mechanical rotation transformer 404. The rotation transformer 404 may be mechanically coupled to the device mount 401 e.g., by linkage 403. As depicted in FIG. 4B, the operation of the device 400 about a single axis may be implemented discussed above with respect to FIGS. 3A-3B. It should be added that the inside flexure beams 403 are designed such that they allow torsion on axis, specifically during the operation of the device to rotate the device mount 401 about an axis orthogonal to the torsion axis of the flexure beam. Each rotation transformer 404 includes one or more flexure beams that allows torsion on an axis that is non-parallel (e.g., perpendicular) to the corresponding flexure beam 403. In other words, the combination of the flexure beams 402, 403 and rotation transformer 404 act as a bi-axial linkage mechanically coupled between the device mount 401 and the rotators and acts as a two degree of freedom (2 DoF) mechanical component which allows rotation about one axis via the rotation transformers, and allows de-coupling from the orthogonal axis via torsional compliance, usually in the inside linkage. By way of example, each rotation transformer 404 may include a first flexure beam two flexure beams attached to each other in a spaced-apart substantially parallel relationship to the each other. Each of the flexure beams in the rotation transformer 404 may be coupled to a corresponding one of the flexure beams 402, 403. The flexure beams 402, 403 and the flexure beams in the rotation transformer 404 may be characterized by substantially different coefficients of torsional stiffness. For example flexure beam 402 may be made more flexible (e.g., having a lesser degree of torsional stiffness) than flexure beam 403 so that most of the rotation of the device mount about the x-axis is due to flexure of outside flexure beam 402.

The combination of flexure beams 402,403 and rotation transformer 404 acts as a bi-axial linkage that is distinct from any of the rotation actuators A, A', B, B'. The flexure beams 402,403 and rotation transformer 404 may be said to be distinct from the actuators A, A', B, B' in that the flexure beams 402,403 and rotation transformer 404 transfer or transform rotational forces generated by the actuators A, A', B, B' but do not take part in generating those forces. As such, an actuator may be removed from a device 400 without necessarily removing the associated bi-axial linkage. Including bi-axial linkages that are distinct from the actuators thus allows both design freedom and modularity.

By way of example, the MEMS device may be a gimbal-less two axis scanner of a type described in V. Milanović, D. T. McCormick, G. Matus, "*Gimbal-less Monolithic Silicon Actuators For Tip-Tilt-Piston Micromirror Applications,*" *IEEE J. of Select Topics* in Quantum Electronics, Volume: 10, Issue: 3, May-June 2004, pages 462-471, which is incorporated herein by reference. In the case of a two axis scanner, separate and independent converter and filter systems may be used to provide drive voltages for each of the two axes. Where such scanners use two or more actuator mechanisms, e.g., comb-drives, each comb-drive may receive a drive signal from an independent source that has been filtered and converted as described herein.

It will be clear to one skilled in the art that the above embodiment may be altered in many ways without departing from the scope of the invention. Embodiments of the present invention facilitate development of four-quadrant devices, which can be more versatile than one-quadrant devices. The distinction between one-quadrant and four-quadrant devices is described in Appendix A of U.S. provisional patent application No. 61/179,334 filed May 18, 2009, which is incorporated herein by reference.

An overview of Gimbal-less micromirror devices is presented in Appendix B of U.S. provisional patent application No. 61/179,334 filed May 18, 2009, which is incorporated herein by reference.

A discussion of linearized gimbal-less two-axis MEMS mirrors is presented in Appendix C of U.S. provisional patent application No. 61/179,334 filed May 18, 2009, which is incorporated herein by reference.

The invention claimed is:

1. A MEMS system, comprising:
   a first rotational actuator having a first drive mechanism configured to drive rotation of a first rotator about a first axis;
   a second rotational actuator having a second drive mechanism configured to drive rotation of a second rotator about a second axis that is not perpendicular to the first axis;
   a first flexible linkage;
   a first linking beam coupled to the first rotator and to the flexible linkage;
   a second linking beam coupled to the second rotator and to the first flexible linkage on a first side of the second rotator;
   a drive beam coupled to the second rotator on a second side of the second rotator opposite the first side;
   a second flexible linkage coupled to the drive beam;
   a device mount coupled to the second flexible linkage, wherein the second flexible linkage is disposed between the drive beam and the device mount,
       wherein the first and second rotational actuators, first and second flexible linkages and first, and second, linking beams and the drive beam are configured to rotate the device mount about a device rotation axis when the first and second rotators rotate about the first and second axes, and
       wherein the first and second rotators, first and second flexible linkages, first and second linking beams and the drive beam are on a common side of the device rotation axis.

2. The system of claim 1 wherein the first and second rotational actuators are bi-directional actuators.

3. The system of claim 1 wherein the first and second rotators are configured to rotate in opposite senses of rotation about the first and second axes respectively.

4. The system of claim 1 further comprising a flexure beam coupled between the device mount and an anchor point wherein the flexure beam is configured to restrict undesired movement of the device mount or restrict undesired rotation of the device mount about an axis other than the device rotation axis.

5. The system of claim 4 wherein the flexure beam coupled between the device mount and the anchor point has a relatively stiff portion along most of its length and a relatively flexible portion close to the anchor point.

6. The system of claim 1 further comprising a third rotational actuator having a third drive mechanism configured to drive rotation of a third rotator about a third axis; a fourth rotational actuator having a fourth drive mechanism configured to drive rotation of a fourth rotator about a fourth axis that is not perpendicular to the third axis, a flexible linkage; a third linking beam coupled to the first rotator and to the flexible linkage; a second linking beam coupled to the second rotator and to the flexible linkage, a second drive beam coupled to the third or fourth rotator, a second flexible linkage coupled to the drive beam and the device mount, whereby rotation of the third and/or fourth actuator causes the second drive beam and second flexible linkage to rotate the device mount about a second device rotation axis that is different from the device rotation axis.

7. The system of claim 1 wherein one or more of the first or second actuators include one or more combdrives.

8. The system of claim 1 wherein one or more of the first or second actuators include one or more balanced rotators comprised of opposing down-force and up-force vertical combdrives on either side of a rotating axis.

9. The system of claim 1 wherein one or more of the first or second actuators include one or more un-balanced uni-directional rotators comprised of either a down-force or an up-force vertical combdrive on either side or on both sides of a rotating axis.

10. The system of claim 1 wherein one or more of the first or second actuators include one or more balanced bi-directional rotators comprised of opposing down-force and up-force vertical combdrives on either side of the central rotating axis, respectively.

11. The system of claim 1 wherein one or more of the first and second actuators includes one or more sets of rotator comb fingers attached to the rotator and one or more sets of fixed comb fingers that interdigitate with the comb fingers.

12. The system of claim 11 wherein the rotator comb fingers include first and second subsets of fingers that are at different levels on the same side of the axis and wherein the fixed comb fingers include first and second subsets of fingers that are at different levels on the same side of the axis.

13. The system of claim 1, wherein one or more of the first and second flexible linkages is a bi-axial linkage including a first flexure beam configured to flex about a first flexure axis, a second flexure beam attached to the first flexure beam, wherein the second flexure beam is configured to flex about a second flexure axis, wherein the second flexure axis is non-parallel to the first flexure axis, the bi-axial linkage further having a third flexure beam attached to the second flexure beam in a spaced-apart substantially parallel relationship to the second flexure beam, wherein the third flexure beam is configured to flex about a third flexure axis that is substantially parallel to the second flexure axis.

14. The system of claim 13 wherein the first flexure axis is substantially perpendicular to the second and third flexure axes.

15. The system of claim 13 wherein the biaxial linkage is mechanically coupled to the device mount.

16. The system of claim 13 wherein the first second and third flexure beams are characterized by substantially different coefficients of torsional stiffness.

17. The system of claim 16 wherein the biaxial linkage is mechanically coupled to the device mount by a beam attached at a first end to the third flexure beam and attached at a second end to the device mount.

18. A MEMS system, comprising:
a first rotational actuator having a first drive mechanism configured to drive rotation of a first rotator about a first axis;
a second rotational actuator having a second drive mechanism configured to drive rotation of a second rotator about a second axis that is not perpendicular to the first axis;
a flexible linkage;
a first linking beam coupled to the first rotator and to the flexible linkage;
a second linking beam coupled to the second rotator and to the flexible linkage;
a drive beam coupled to the first or second rotator; and
a flexible linkage coupled to the drive beam and a device mount coupled to the flexible linkage, whereby rotation of the first and/or second actuator causes the drive beam and linkage to rotate the device mount about a device rotation axis,
wherein one or more of the flexible linkages is a bi-axial linkage including a first flexure beam configured to flex about a first flexure axis, a second flexure beam attached to the first flexure beam, wherein the second flexure beam is configured to flex about a second flexure axis, wherein the second flexure axis is non-parallel to the first flexure axis, the bi-axial linkage further having a third flexure beam attached to the second flexure beam in a spaced-apart substantially parallel relationship to the second flexure beam, wherein the third flexure beam is configured to flex about a third flexure axis that is substantially parallel to the second flexure axis.

19. The system of claim 18 wherein the first flexure axis is substantially perpendicular to the second and third flexure axes.

20. The system of claim 18 wherein the biaxial linkage is mechanically coupled to the device mount.

21. The system of claim 18 wherein the first second and third flexure beams are characterized by substantially different coefficients of torsional stiffness.

22. The system of claim 21 wherein the biaxial linkage is mechanically coupled to the device mount by a beam attached at a first end to the third flexure beam and attached at a second end to the device mount.

23. A combdrive actuator, comprising:
a rotator coupled to an anchor point by a flexible member that permits rotation of the rotator about an axis while providing a restoring force;
one or more sets of rotator comb fingers attached to the rotator; and
one or more sets of fixed comb fingers that interdigitate with the comb fingers, wherein the fixed comb fingers are fixed with respect to the anchor point,
wherein the rotator comb fingers include first and second subsets of fingers that are at different levels on the same side of the axis and wherein the fixed comb fingers include first and second subsets of fingers that are at different levels on the same side of the axis.

24. A MEMS system, comprising:
a first rotational actuator having a first drive mechanism configured to drive rotation of a first rotator about a first axis;
a second rotational actuator having a second drive mechanism configured to drive rotation of a second rotator about a second axis;
first and second flexible linkages;
a first drive beam coupled to the first rotator and to the first flexible linkage;
a second drive beam coupled to the second rotator and to the second flexible linkage; and
one or more device mounts coupled to the first and second flexible linkages, whereby rotation of the first and second rotators causes the device mount to rotate or piston, wherein the one or more device mounts are configured to provide distributed points of attachment of a device.

25. The system of claim 24 wherein the one or more device mounts include first and second spaced-apart device mounts.

26. The system of claim 25 wherein the first device mount is coupled to the first flexible linkage and wherein the second device mount is coupled to the second flexible linkage and wherein a device is mounted to the first and second device mounts.

27. The system of claim 25 wherein the first and second device mounts are attached to a common support, wherein the common support is coupled to the first and second flexible linkages.

28. The system of claim 24 wherein the first and/or second flexible linkage includes stiff beam having first and second ends and a flexure beam mounted at both ends to the stiff beam.

29. The system of claim 24 wherein the first axis is not perpendicular to the second axis.

30. The system of claim 24 wherein the second axis is perpendicular to the first axis.

\* \* \* \* \*